United States Patent
Miki

(10) Patent No.: US 10,203,892 B2
(45) Date of Patent: Feb. 12, 2019

(54) SEMICONDUCTOR DEVICE

(71) Applicant: Renesas Electronics Corporation, Tokyo (JP)

(72) Inventor: Takeo Miki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 84 days.

(21) Appl. No.: 15/339,076

(22) Filed: Oct. 31, 2016

(65) Prior Publication Data

US 2017/0153835 A1  Jun. 1, 2017

(30) Foreign Application Priority Data

Nov. 26, 2015 (JP) .................................. 2015-230839

(51) Int. Cl.
*G06F 3/06* (2006.01)
*G11C 15/04* (2006.01)

(52) U.S. Cl.
CPC .......... *G06F 3/0625* (2013.01); *G06F 3/0634* (2013.01); *G06F 3/0653* (2013.01); *G06F 3/0679* (2013.01); *G11C 15/04* (2013.01); *G11C 15/046* (2013.01)

(58) Field of Classification Search
CPC ....... G11C 15/04; G11C 15/00; G11C 15/046; G06F 11/1064; G06F 2212/1028; G06F 3/0625; G06F 3/0634; G06F 3/0653; G06F 3/0679
See application file for complete search history.

(56) References Cited

U.S. PATENT DOCUMENTS

| 7,272,685 | B2 | 9/2007 | Inoue | |
|---|---|---|---|---|
| 8,031,503 | B1 * | 10/2011 | Gyllenhammer | G11C 15/04 365/49.1 |
| 9,436,782 | B2 | 9/2016 | Kuramoto | |
| 2007/0079058 | A1 * | 4/2007 | Yoon | G11C 15/00 711/108 |
| 2011/0317462 | A1 | 12/2011 | Gyllenhammer et al. | |

FOREIGN PATENT DOCUMENTS

| JP | H04-129086 A | 4/1992 |
|---|---|---|
| JP | H06-333395 A | 12/1994 |
| JP | 2005-018942 A | 1/2005 |
| JP | 2010-277642 A | 12/2010 |
| JP | 2014-022010 A | 2/2014 |

OTHER PUBLICATIONS

Japanese Office Action dated Oct. 16, 2018, corresponding Japanese Patent Application No. 2015-230839, with an English translation thereof.

* cited by examiner

*Primary Examiner* — Zhuo H Li
(74) *Attorney, Agent, or Firm* — McGinn I.P. Law Group, PLLC.

(57) ABSTRACT

A semiconductor device that includes a memory system is configured to accept input of search data and to search in parallel respective rows of a memory cell array such as a CAM and so forth for data held in a memory. The memory system detects whether an inflow amount of the search data that is input is at least a fixed amount by monitoring a packing ratio of an FIFO buffer that a search command is held. The memory system controls a speed of search processing by dividing the memory cell array into blocks and setting each block as a search processing object in accordance with a result of detection.

11 Claims, 19 Drawing Sheets

FIG. 12

THRESHOLD VALUE SETTING REGISTER (15)

| QUEUE USED AMOUNT (PACKING RATIO) | DIVISION COEFFICIENT (NUMBER OF TIMES SEARCHED) |
|---|---|
| >70% | 1 |
| 50% TO 70% | 2 |
| 30% TO 50% | 3 |
| 10% TO 30% | 4 |
| ≤10% | 5 |

FIG. 13

THRESHOLD VALUE SETTING REGISTER (15)

| QUEUE USED AMOUNT (PACKING RATIO) | PROPRIETY OF DIVISION |
|---|---|
| >70% | TERMINATE DIVISIONAL SEARCH OF CAM CELL ARRAY |
| ≤50% | START DIVISIONAL SEARCH OF CAM CELL ARRAY |

FIG. 17A

THRESHOLD VALUE SETTING REGISTER ~15

| QUEUE USED AMOUNT (PACKING RATIO) | DIVISION COEFFICIENT (NUMBER OF TIMES SEARCHED) |
|---|---|
| >70% | 1 |
| 50% TO 70% | 2 |
| 30% TO 50% | 3 |
| 10% TO 30% | 4 |
| ≤10% | 5 |

FIG. 17B

DIVISION NUMBER HISTORY INFORMATION ~29

| DIVISION NUMBER (NUMBER OF TIMES SEARCHED) | NUMBER OF TIMES EXECUTED IN SPECIFIC TIME PERIOD | FREQUENCY |
|---|---|---|
| 1 | 100 TIMES | 5% |
| 2 | 400 TIMES | 20% |
| 3 | 1200 TIMES | 60% |
| 4 | 200 TIMES | 10% |
| 5 | 100 TIMES | 5% |

CHANGE DIVISION NUMBER ACCORDING TO REMAINING AMOUNT OF QUEUES ON THE BASIS OF HISTORY OF DIVISION NUMBER

FIG. 17C

THRESHOLD VALUE SETTING REGISTER ~15

| QUEUE USED AMOUNT (PACKING RATIO) | DIVISION COEFFICIENT (NUMBER OF TIMES SEARCHED) |
|---|---|
| >70% | 1 |
| 52.5% TO 70% | 2 |
| 10.5% TO 52.5% | 3 |
| 3.5% TO 10.5% | 4 |
| ≤3.5% | 5 | ps # SEMICONDUCTOR DEVICE

CROSS-REFERENCE TO RELATED APPLICATIONS

The disclosure of Japanese Patent Application No. 2015-230839 filed on Nov. 26, 2015 including the specification, drawings and abstract is incorporated herein by reference in its entirety.

BACKGROUND

The present disclosure relates to a technology for searching a memory for data that is held in the memory and, in particular, relates to a technology for reducing power consumption of a memory system such as a CAM (Content Addressable Memory) and so forth.

Pieces of communication equipment such as desktop PCs (Personal Computers), laptop PCs, tablet terminals, smartphones and other pieces of communication equipment are coupled together over a network. Communication traffic among these pieces of the communication equipment is more and more increased. Accordingly, it is requested for network equipment such as routers, switches and other pieces of network equipment to perform processing at a higher speed. A memory system that operates at a high speed is used in order to perform processing such as route search and so forth by such network equipment and so forth at a high speed.

For example, in a network router and so forth, routing of an IP (Internet Protocol) packet is performed. The network router includes, for example, the content addressable memory (CAM). The CAM is configured by a plurality of CAM cells. Search of the CAM is performed by activating a search line (SL) on the basis of a data array to be searched and deciding matching/mismatching with each entry in a CAM array. As a result of search, the CAM outputs an address of the entry that matches the search line. The CAM that the network router includes is configured to hold an IP address in the CAM cell. The network router performs routing by collating the address of each entry with an IP address that is held in the CAM cell on the basis of the IP address included in the IP packet that is input.

Since the CAM compares data of each entry in the CAM array with data to be searched in parallel for each entry in this way, high-speed data searching is attained. Although the CAM searches the plurality of entries in parallel and therefore high-speed searching is attained, high-speed search involves pre-charging and so forth to each match line (ML) and therefore the power consumption is comparatively increased. Therefore, various proposals have been made so far for the technology of reducing the power consumption of the system including the CAM. For example, Japanese Unexamined Patent Application Publication No. 2005-18942 describes an integrated circuit with associative memory function configured to reduce a load exerted on a control unit such as an NPU (Network Processor Unit), an ASIC (Application Specific Integrated Circuit) and so forth. In Japanese Unexamined Patent Application Publication No. 2005-18942, a technology for detecting matching between the data to be searched and data stored in the memory while shifting a search keyword.

SUMMARY

In the network equipment and so forth such as the router, the switch and so forth, it is favorable to avoid occurrence of a situation that data is not completely processed and the operation becomes unstable as hard as possible. This is because stabilization of the operation of the network equipment leads to a reduction in interruption period of the network and also leads to improvement of reliability of the network. Accordingly, when the CAM is used in equipment that the high reliability of the network equipment such as the routers, the switches and so forth is requested, there are cases where design of the equipment is performed by providing a comparatively large performance margin, taking the stability of the operation of the CAM into consideration. It is allowed to operate the CAM stably even when a high load has been exerted instantaneously by configuring the equipment in this way. However, when the high load is not exerted on the equipment, search processing is performed on the CAM with the performance that is more than necessary and a reduction in power consumption of the CAM is hindered.

Accordingly, it is requested to provide a technology for more reducing the power consumption of the memory system while stabilizing the processing of the equipment also at the high load. The present disclosure aims to provide a technology for stabilizing the processing performed at the high load while reducing the power consumption of the memory system.

Other subject matters and novel features of the present disclosure will become apparent from the description of the present specification and the appended drawings.

According to one embodiment of the present disclosure, there is provided a semiconductor device that is allowed to accept input of search data and to search in parallel respective rows of a memory cell array for data that is held in a memory. The semiconductor device includes a search control unit configured to detect whether an inflow amount of the search data that is input is at least a fixed amount and to adjust a speed of search processing performed on the memory, and an output control unit configured to output a signal indicating a result of the search processing performed on the memory.

In the semiconductor device according to one embodiment, the speed at which the retrieval processing is performed on the memory is controlled in accordance with the load while exhibiting the processing performance of the memory that is requested at the high load, in order to adjust the speed of the retrieval processing performed on the memory in accordance with whether the inflow amount of the retrieval data to be input into the semiconductor device is at least the fixed amount. Accordingly, it becomes possible to stabilize the processing at the high load while reducing a peak of the power consumption during the retrieval processing by down-speeding of the retrieval processing.

BRIEF DESCRIPTION OF THE DRAWINGS

FIG. 12 is a table illustrating one example that in the control circuit 100 of the memory system 1 according to a fifth embodiment, a threshold value set register 15 holds setting of the number of divisions according to a remaining amount of the queue at multiple stages.

FIG. 13 is a table illustrating one example that in the control circuit 100 of the memory system 1 according to a sixth embodiment, the threshold vale set register 15 holds a threshold value with which retrieval of the CAM cell array started by dividing the CAM cell array in accordance with the remaining amount of the queue and a threshold value with which divisional retrieval processing is terminated.

FIG. 17A is a table illustrating one example of a configuration that the memory system 1 according to a ninth embodiment holds a history of the number of divisions when having performed the retrieval processing on the CAM cell array and corrects the number of divisions in the retrieval processing to be performed on the CAM cell array on the basis of the history.

FIG. 17B is a table illustrating another example of a configuration that the memory system 1 according to a ninth embodiment holds a history of the number of divisions when having performed the retrieval processing on the CAM cell array and corrects the number of divisions in the retrieval processing to be performed on the CAM cell array on the basis of the history.

FIG. 17C is a table illustrating a further example of a configuration that the memory system 1 according to a ninth embodiment holds a history of the number of divisions when having performed the retrieval processing on the CAM cell array and corrects the number of divisions in the retrieval processing to be performed on the CAM cell array on the basis of the history.

DETAILED DESCRIPTION

In the following, preferred embodiments of the present invention will be described in detail with reference to the appended drawings. Incidentally, in the following description, the same numerals are assigned to the same components. The components are the same in name and function. Accordingly, detailed description thereof is not repetitively made.

First Embodiment

A semiconductor device according to the first embodiment will be described with reference to the drawings.
<Configuration of the Semiconductor Device Including a Memory System>

Figure 1:
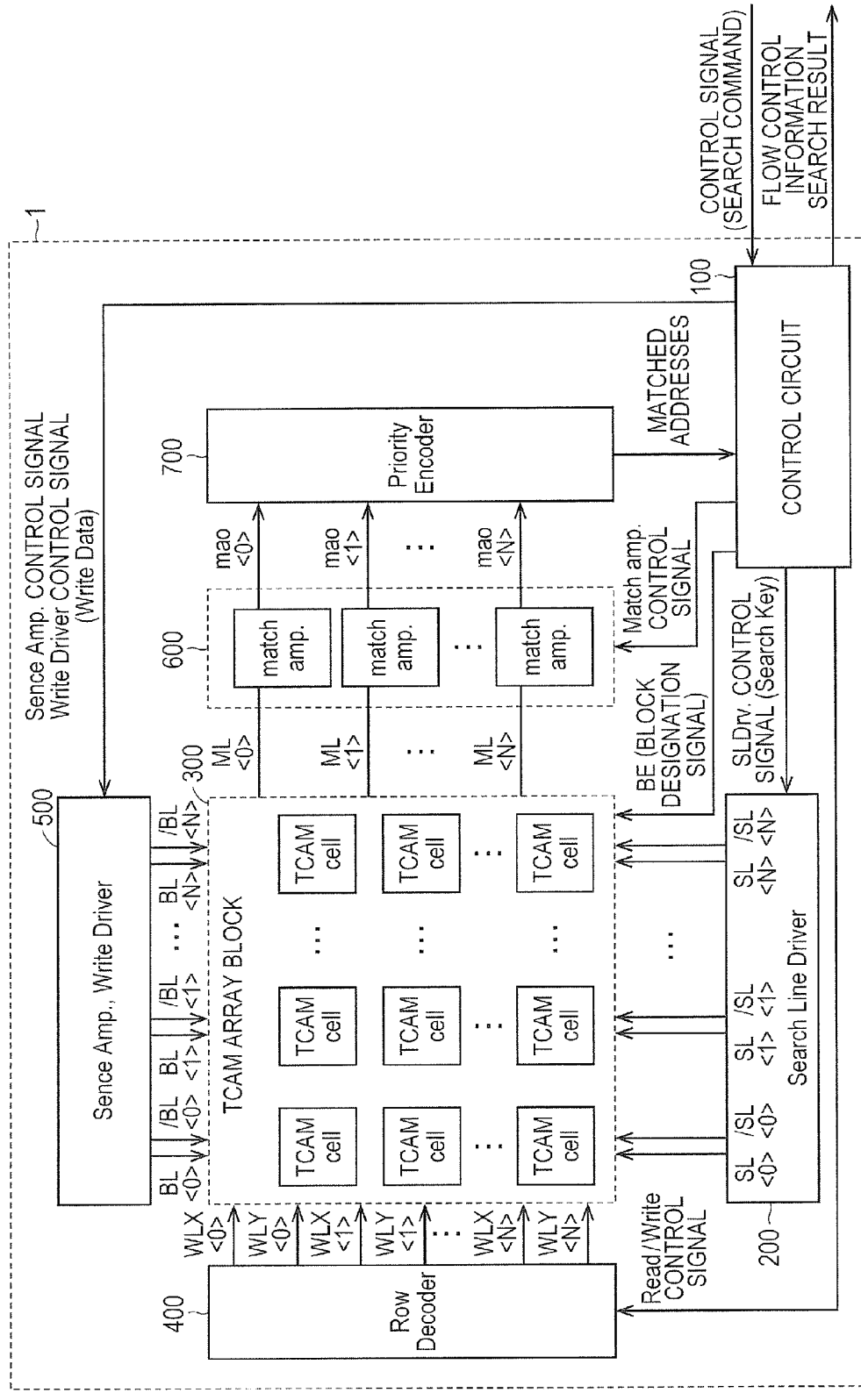
FIG. 1 is a block diagram illustrating one example of a configuration of a memory system 1 included in a semiconductor device according to a first embodiment.

FIG. 1 is a diagram illustrating one example of a configuration of the memory system 1 included in the semiconductor device according to the first embodiment. As illustrated in FIG. 1, the memory system 1 includes the control circuit 100, a search line driver 200, a TCAM array block 300, a row decoder 400, a sense amplifier/write-driver 500, a match amplifier 600, a priority encoder 700 and so forth.

The TCAM array block 300 holds data in a plurality of entries. Each entry is configured by a plurality of CAM cells (TCAM cells). Although, in the example in FIG. 1, the TCAM array block 300 that is configured by the CAM cells of N rows×N columns, the arrangement of the CAM cells is not limited to N rows×N columns. An address is assigned to each entry. The TCAM array block 300 accepts inputting of the retrieval data and determines in parallel whether the retrieval data matches the data held in each entry. The TCAM array block 300 is configured as a ternary associative memory (Ternary CAM). It is possible for each CAM cell to take three values of a high value ("1"), a low value ("0"), and a don't care value ("X").

The TCAM array block 300 accepts data writing into the CAM cell in units of rows (in units of entries). The sense amplifier/write driver 500 operates in accordance with control with a sense amplifier control signal (Sens Amp. Signal) and a write driver control signal (Write Driver control signal) from the control circuit 100. The sense amplifier/write driver 300 activates a bit line (BL) on the basis of data (Write Data) to be written into the TCAM array block 300. In addition, the row decoder 400 activates a word line (WL) od a row as a writing object in the TCAM array block 300. The row decoder 400 operates in accordance with a Read/Write control signal from the control circuit 100, accepts designation of the address that serves as a data reading/writing object to the TCAM array block 300, and activates the word line (WL) that corresponds to the accepted address. The memory system 1 writes data into the designated address of the TCAM array block 300 via the bit line and the word line.

The TCAM array block 300 accepts the data used for search from a signal that is output from the search line driver 200 onto a search line (SL). The search line driver 200 operates in accordance with control using a search line driver control signal (SLDrv. Control signal) from the control circuit 100. The search line driver 200 activates the search line SL on the basis of data for search (Search Key) used to search the TCAM array block 300. When the TCAM array block 300 is to be searched, the search data is output to the TCAM array block 300 via the search line (SL). In the TCAM array block 300, a match line (ML) maintains a high level for the entry that holds the data that matches the search data.

The match amplifier 600 operates in accordance with control using a match amplifier control signal (Match amp. control signal) that the control circuit 100 outputs. The match amplifier 600 amplifies the output from the match line and outputs an entry search decision signal mao to the priority encoder 700 in searching of the TCAM array block 300.

When in the plurality of entries, the search data matches the data held in each entry of the TCAM array block 300, the priority decoder 700 outputs any one piece of data preferentially. For example, when the data held in each entry of the TCAM array block 300 is searched by using the value "X" as the search data, pieces of data held in the plurality of entries may possibly hit by search. The priority decoder 700 outputs the address that corresponds to the match line that has hit by search as a search result (a match address) in accordance with, for example, a predetermined order of priority (for example, in the entries in the TCAM array block 300, the priority is given to an entry that is the smallest in address) to the control circuit 100.

The control circuit 100 is a circuit adapted to control a searching operation on the TCAM array block 300 of the memory system 1. The control circuit 100 accepts the control signal that includes a search command to the TCAM array block 300 from a circuit that is arranged outside the memory system 1, operates in accordance with a predetermined clock signal and output the result of search performed on the TCAM array block 300. In addition, the control circuit 100 decides a stagnant state (for example, the uses state of the queue that holds the search command and so forth) of the search command accepted from the circuit that is arranged outside the memory system 1 and outputs a result of decision to the circuit arranged outside the memory system 1 as flow control information.

Figure 2:
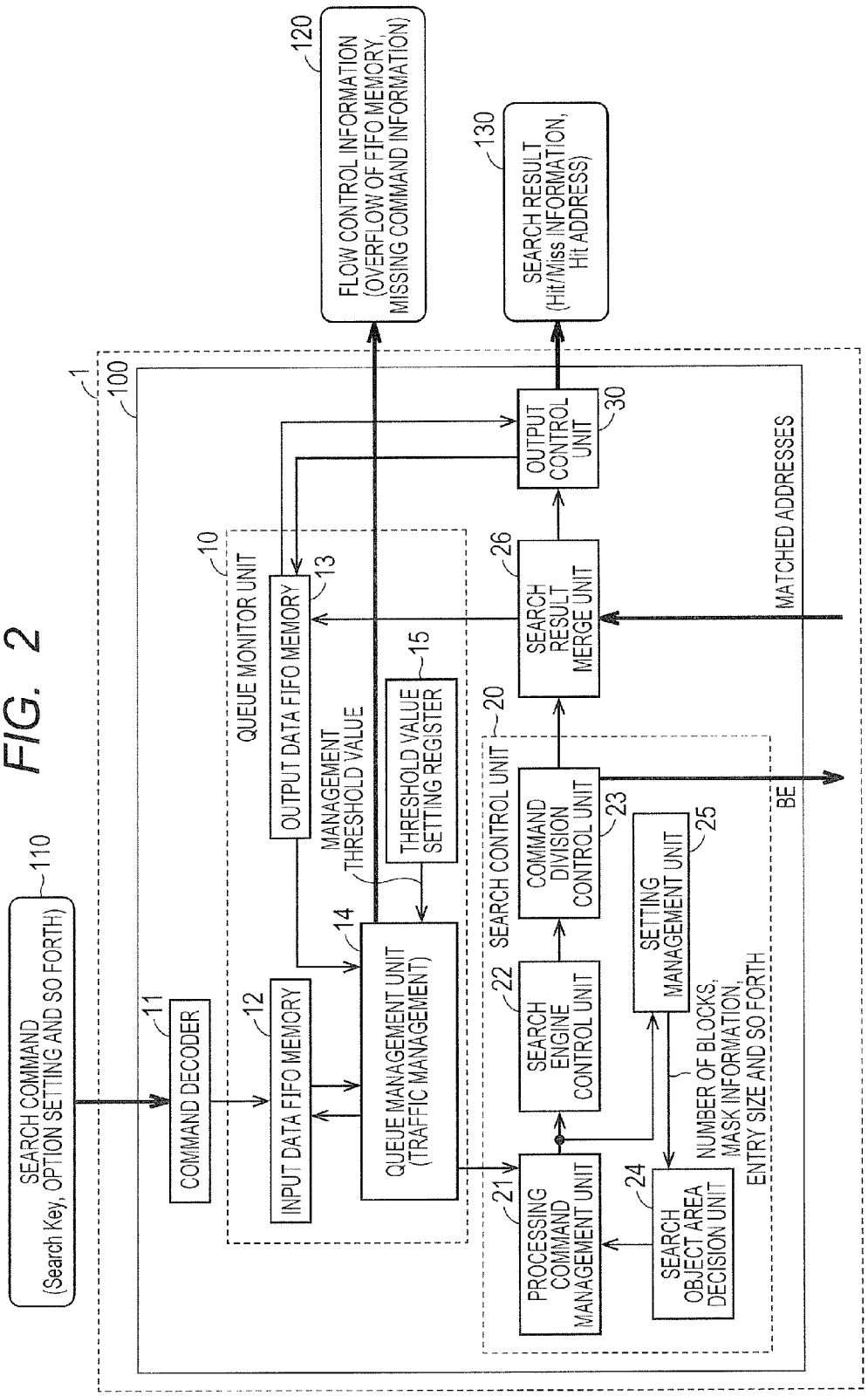
FIG. 2 is a block diagram illustrating one example of a configuration of a control circuit 100.

FIG. 2 is a block diagram illustrating one example of a configuration of the control circuit 100. The control circuit 100 is configured by each circuit that exhibits the function of each block illustrated in FIG. 2. As illustrated in FIG. 2, the control circuit 100 includes a command decoder 11, a queue monitor unit 10, the search control unit 20, a search result merge unit 26, an output control unit 30 and so forth.

The control circuit 100 receives a search command 110 from the outside of the memory system 1 (for example, the circuit that is arranged outside the memory system 1). The search command 110 is a command used to search for the data held in the TCAM array block 300 of the memory system 1 and includes the search data (Search Key), setting of various options upon search and so forth. As the search data (Search Key), for example, a character string to be searched, numerical data such as the IP address and so forth and other pieces of data may be given.

The command decoder 11 decodes the command that the memory system 1 has received and performs processing of converting the format of the command such that it becomes possible for each circuit in the memory system 1 such as the control circuit 100 and so forth to process the command and so forth. For example, the command decoder 11 decides whether the command that the memory system 1 has received is the search command, a write/read command to the data held in the TCAM array block 300, a command for performing other various kinds of setting or other commands and performs conversion and so forth of various formats in accordance with a result of decision. The command decoder 11 converts the format of the search command 110 into the format that is executable for each circuit in the control circuit 100.

The queue monitor unit 10 monitors an inflow amount of the search data that is input into the memory system 1, and when the inflow amount of the search data is at least a fixed amount, outputs a signal indicating that the inflow amount of the search data is at least the fixed amount to the search control unit 20. In the queue monitor unit 10, a threshold value to be compared with a used amount of an input data FIFO memory 12 is set in advance in the threshold value setting register 15. The queue monitor unit 10 outputs a signal indicating a result of comparison to the search control unit 20 on the basis of a result of comparison that a usage state of the queue (such as the used amount of the queue and so forth) is compared with the threshold value set in the threshold value setting register 15. For example, when the usage state of the queue does not exceed the threshold value that has been set in advance in the threshold value setting register 15, the control circuit 100 performs the search processing by dividing each block into parts in order to suppress the peak power used when performing the search processing on the TCAM array block 300. In addition, for example, when the usage state of the queue exceeds the threshold value that has been set in advance in the threshold value setting register 15, the control circuit 100 performs the search processing on the TCAM array block 300 with no division. The control circuit 100 processes the commands that stagnate in the queue at a high speed by preferring the processing speed of the search processing.

As illustrated in FIG. 2, the queue monitor unit 10 includes the input data FIFO memory 12, an output data FIFO memory 13, a queue management unit 14, the threshold value setting register 15 and so forth. The input data FIFO memory 12 is a memory adapted to temporarily store data that has been converted into the format that is executable in the control circuit 100 by the command decoder 11. The input data FIFO memory 12 is, for example, a buffer memory adapted to hold the search data that is input into the memory system 1. It is possible for the control circuit 100 to cope with a situation that interruption processing has occurred when performing the search processing on the memory system 1 by temporarily buffering the data that is input into the memory system 1 by the input data FIFO memory 12. In addition, it is possible to absorb latency between the memory system 1 and the circuit that is arranged outside the memory system 1 by the input data FIFO memory 12.

The output data FIFO memory 13 is a buffer memory adapted to hold data to be output from the control circuit 100 to the outside of the memory system 1 (for example, the circuit that is arranged outside the memory system 1) such as a result of the search processing performed on the TCAM array block 300 and so forth. For example, when the external circuit to which the memory system 1 outputs the result of search on the TCAM array block 300 is in a state where it is difficult to receive a result of output from the memory system 1 (a busy state), it is desired to buffer the data in the output data FIFO memory 13. In addition, when the result of the search processing performed on the TCAM array block 300 is to be output to the circuit arranged outside the memory system 1 by adding another d piece of data and when arbitration of a data bus of the memory system 1 has occurred, it is desired to buffer the output data by the output data FIFO memory 13. When a data volume of the data held in the output data FIFO memory 13 exceeds a threshold value, there is a possibility that overflow and so forth may occur. Accordingly, the queue management unit 14 may determine the number of blocks (the number of divisions) when performing the search processing on the TCAM array block 300 by outputting information on the usage state of the output data FIFO memory 13 to the search control unit 20.

The threshold value setting register 15 is a register adapted to hold the threshold value to be compared with the usage state of the input data FIFO memory 12. It is possible to set the threshold value that is held in the threshold value setting register 15 by, for example, accepting input of a signal for option setting and so forth from the outside of the memory system 1 (for example, the circuit that is arranged outside the memory system 1) by the control circuit 100. In addition, the threshold value setting register 15 may be configured to hold the threshold value to be compared with the usage state of the output data FIFO memory 13. When the used amount of the output data FIFO memory 13 is in excess of the threshold value, the queue management unit 14 outputs a signal to the search control unit 20 in order to suppress overflow of the output data FIFO memory 13. It becomes possible for the search control unit 20 to perform the search processing divisionally at a low speed and to temporarily suspend the search processing and so forth by doing in this way.

The queue management unit 14 manages the usage state of the input data FIFO memory 12 by comparing the threshold value (a management threshold value) that is held in the threshold value setting register 15 with the usage state of the input data FIFO memory 12. When the used amount of the input data FIFO memory 12 is in excess of the fixed amount, the queue management unit 14 outputs a signal indicating that the used amount of the input data FIFO memory 12 is in excess of the fixed amount to the search control unit 20. In addition, the queue management unit 14 manages the used amount of the output data FIFO memory 13. For example, when processing stagnates in the circuit arranged outside the memory system 1, there are cases where the used amount of the output data FIFO memory 13 is gradually increased because the result of the search processing performed on the TCAM array block 300 and so forth are output from the output control unit 30 to the circuit arranged outside the memory system 1. The queue management unit 14 manages the usage state of the output data FIFO memory and outputs the signal indicating the result of comparison between the usage state of the output data FIFO memory 13 and the threshold value held in the threshold value setting register 15 to the search control unit 20 in this way.

In addition, the queue management unit 14 monitors the used amounts of the input data FIFO memory 12 and the output data FIFO memory 13 and outputs the usage state of the queue to the circuit that is arranged outside the memory system 1 as flow control information 120. When the processing speed of the control circuit 100 is faster than an inflow speed of the command to be input from the circuit arranged outside the memory system 1 to the control circuit 100, it may be said that it hardly occurs that commands that the control circuit 100 does not yet process stagnate in the input data FIFO memory 12. However, when the inflow speed of the data into the control circuit 100 is in excess of the processing speed of the control circuit 100, commands to be processed by the control circuit 100 are accumulated in the input data FIFO memory 12 and missing and so forth of the commands may occur due to overflow. The queue management unit 14 sets the threshold value to be compared with a load on the input data FIFO memory 12 in advance in a register, a memory area for management and other storage areas, compares the threshold value with a loaded state of the input data FIFO memory 12 and outputs an alert signal (flow control information) to the circuit that is arranged outside the memory system 1 in case of the loaded state that is in excess of the threshold value, in order to prevent occurrence of overflow, command missing and so forth.

In addition, for example, there are cases where the control circuit 100 is used for traffic management of a network. In this case, it is assumed that input of the commands and so forth is made to the control circuit 100 exceeding a processing capacity that has been set in advance. In this case, the control circuit 100 may perform processing such as traffic polishing, traffic shaving and so forth in order to perform traffic management of the network. The traffic polishing means to discard the commands that the control circuit 100 has accepted without levelling. In addition, traffic shaving means to perform levelling in a range that the levelling is allowed and to perform processing of discarding the commands that have failed to be leveled. Here, it is assumed that the queue monitor unit 10 monitors the traffic of the network in this way. In this case, when the traffic is within a range not exceeding the processing capacity that has been set in advance, the control circuit 100 makes the search control unit 20 operate to perform the search processing divisionally so as to reduce the peak current. Thereby, it is possible for the memory system 1 to reduce a power supply capability that is requested for the power supply to the memory system 1. In addition, it is possible for the memory system 1 to reduce power supply noise and to reduce the number of malfunctions of the memory system 1 caused by the noise.

The search control unit 20 decides whether the search processing to be performed on the TCAM array block 33 is divisionally performed in units of blocks of the CAM cell array or the respective entries of the CAM cell array are searched in parallel in a lump. The search control unit 20 performs this decision processing on the basis of information sent from the queue monitor unit 10 and information that is held in a setting management unit 25.

The search control unit 20 detects whether the inflow amount of the search data that is input into the memory system 1 is at least the fixed amount. The search control unit 20 adjusts the speed of the search processing performed on the TCAM array block 300 in accordance with a result of detection. The search control unit 20 adjusts the speed of the search processing on the basis of a signal that the queue monitor unit 10 outputs. The search control unit 20 performs the search processing on the TCAM array block 300, targeting on at least one of the respective parts (blocks) obtained by dividing the CAM cell array of the TCAM array block 300 into the plurality of parts (blocks) as a search processing object. Thereby, the search control unit 20 adjusts the speed of the search processing performed on the TCAM array block 300.

As illustrated in FIG. 2, the search control unit 20 includes a processing command management unit 21, a search engine control unit 22, a command division control unit 23, a search object area decision unit 24, a setting management unit 25 and so forth. The processing command management unit 21 reads out the data stored in the input data FIFO memory 12 and manages the commands output from the circuit arranged outside the memory system 1 such as the search command 110 and so forth. For example, the processing command management unit 21 reads out the data stored in the input data FIFO memory 12 and manages the order that the respective commands are processed and processing details such that on which circuit the processing is performed and what operation is performed on the circuit to be processed (whether searching or writing is performed on the TCAM array block 300 and so forth).

When the control circuit 100 performs the search processing on the TCAM array block 300, the search engine control unit 22 generates a control signal used to drive each circuit such as the search line driver 200 and so forth and outputs the control signal so generated to each circuit via, for example, the command division control unit 23.

When the control circuit 100 divides the CAM cell array that configures the TCAM array block 300 block by block and performs the search processing on each block, the command division control unit 23 generates a control signal (a block enable signal BE) used to designate the block to be searched. The command division control unit 23 outputs the generated control signal to each circuit. The search data is output to the TCAM array block 300 in synchronization with output of the control signal used to start the search processing from the command division control unit 23.

The search object area decision unit 24 reads out a parameter for search that is held in the setting management unit 25 as the setting and decides the range of the CAM cell array to be searched that is indicated in the search command 110. For example, the search object area decision unit 24 reads out information on the number of blocks that configures the TCAM array block 300, kinds of data that the TCAM array block 300 holds (whether the TCAM array block 300 holds information on address such as the IP address and so forth), a range to be subjected to mask processing against the search data that is input from the outside of the memory system 1, a size of the search data and other pieces of information as the setting. For example, when the plurality of kinds of CAM memories are used in the memory system 1, the search object area decision unit 24 decides the range of the CAM cell array to be searched by identifying the CAM memory to be searched and so forth on the basis of the above-mentioned pieces of information that have been read out of the setting management unit 25. The processing command management unit 21 sends a search instruction to the search engine control unit 22 on the basis of a result of decision by the search object area decision unit 24.

The setting management unit 25 stores information that is used for deciding the range of the CAM cell array to be activated when performing the search processing on the TCAM array block 300. For example, the setting management unit 25 designates and stores the blocks that configure the CAM cell array in correspondence with the kinds (the address information and so forth) of data to be stored in the TCAM array block 300.

When the search processing has been performed on the TCAM array block 300 by dividing the CAM cell array in units of blocks, the search result merge unit 26 accepts and merges results of search (such as matched addresses and so forth) performed on the respective blocks. The search result merge unit 26 makes the output data FIFO memory 13 store the search result after merged.

The output control unit 30 outputs the result of search processing performed on the TCAM array block 300 to the circuit that is arranged outside the memory system 1 as a search result 130. The search result 130 includes whether there has existed data that matches the search data (Hit/Miss information), and that data (such as a Hit address and so forth) when there has existed the data that matches the search data.

Figure 3:
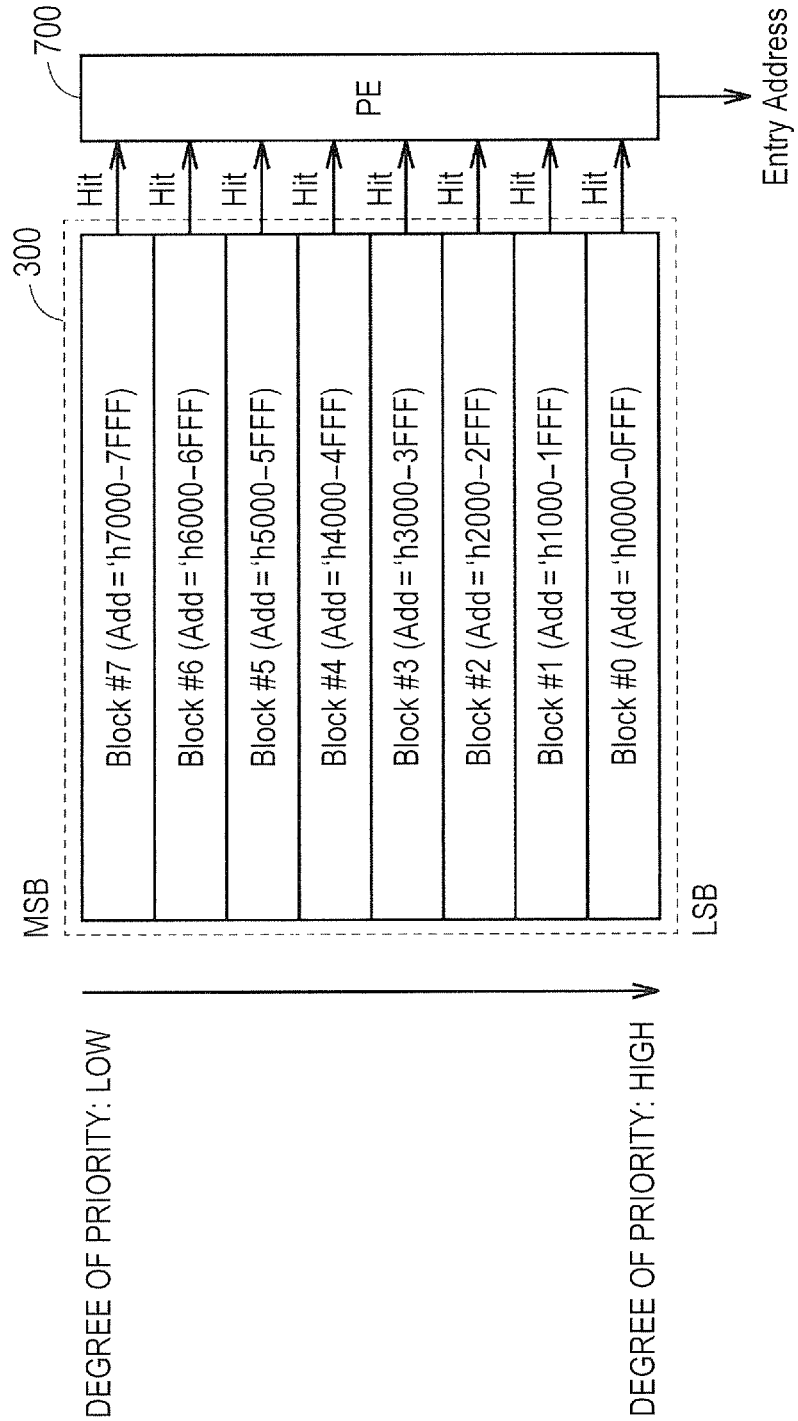
FIG. 3 is a diagram illustrating one example of degrees of relative priority of respective blocks that configure a CAM cell array of a TCAM (Ternary CAM) array block 300.

FIG. 3 is a table illustrating one example of degrees of priority of the respective blocks that configures the CAM cell array of the TCAM array block 300. As illustrated in FIG. 3, each block that configures the CAM cell array of the TCAM array block 300 includes the plurality of entries. In addition, the degree of priority is set to each block and the degree of priority that is higher than others is set to the block that is smaller in address than others. When the search processing is divisionally performed in units of blocks that configure the CAM cell array, the search control unit 20 may control to perform the search processing in order starting from the block (for example, the block that includes the entry that is smaller than others in address is preferred) that is higher in degree of priority than others in the CAM cell array and may control not to perform the search processing on the block on which the search processing is not yet performed when the search result is output from the priority encoder 700 and the control circuit 100 has received the search result. Thereby, it is possible to lower the power consumption of the memory system 1 and it is also possible to reduce not only the peal power but also the total amount of the electric power that the memory system 1 consumes.

Figure 4A:
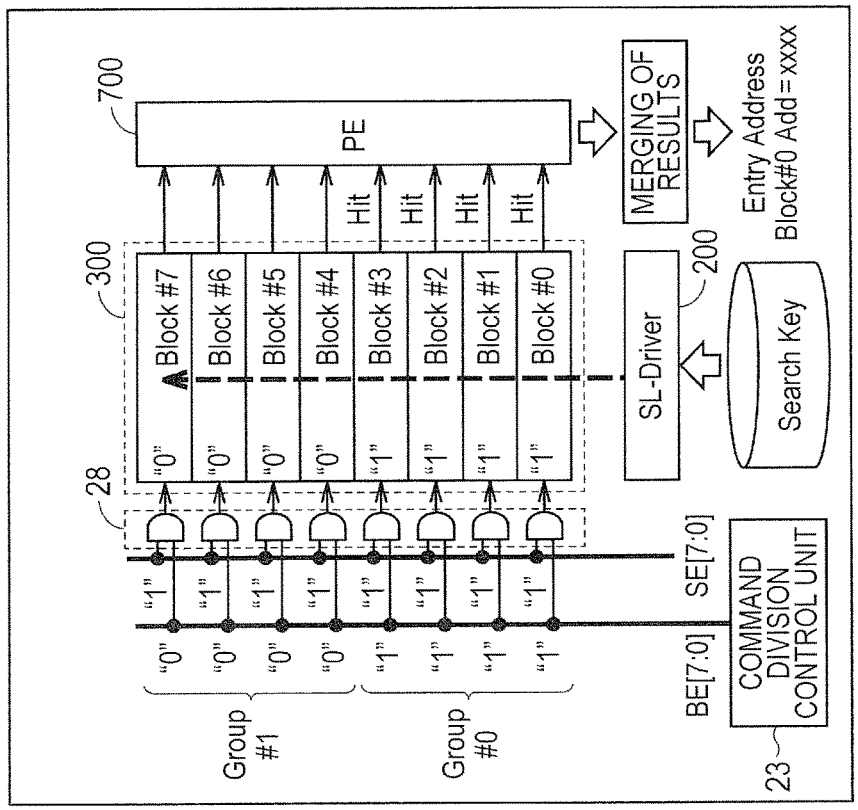
FIG. 4A is a diagram illustrating one example of retrieval processing of related art.
Figure 4B:
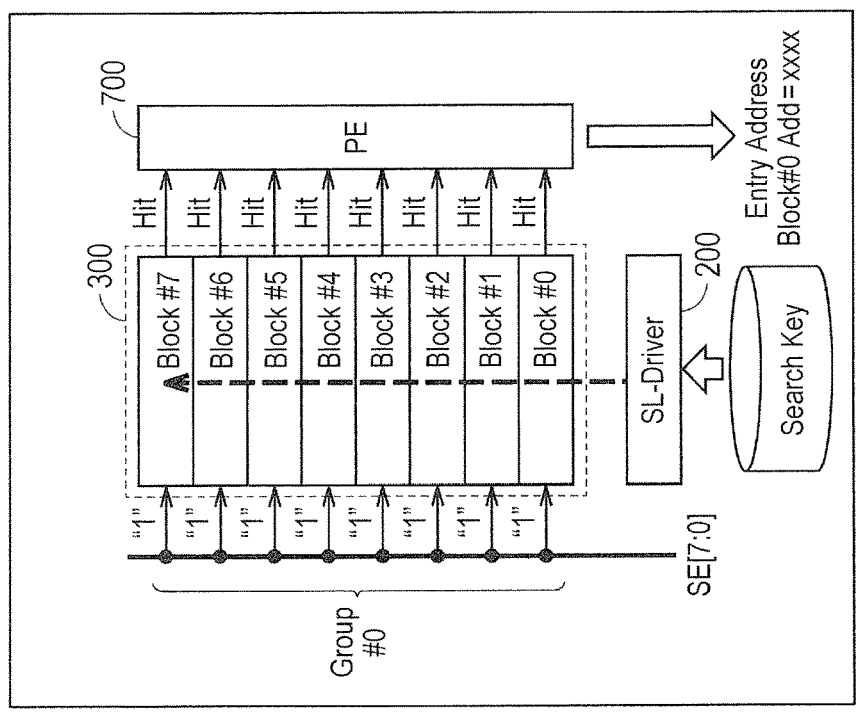
FIG. 4B is a diagram illustrating one example of retrieval processing to be divisionally performed according to the first embodiment.

FIG. 4A is a diagram illustrating one example of retrieval processing of related art and FIG. 4B is a diagram illustrating one example of retrieval processing to be divisionally performed according to the first embodiment.

FIG. 4A is a diagram illustrating one example of an outline of a configuration for performing the search processing on the block that has been selected to be searched in related art. FIG. 4B is a diagram illustrating one example of an outline of a configuration for dynamically determining whether the search processing is performed by dividing the range of the Cam cell array to be searched in units of blocks on the basis of a result of monitoring of the queue by the queue monitor unit 10 in the first embodiment.

As illustrated in a state in FIG. 4A, in related art, a semiconductor circuit manages each block of the CAM cell array as a profile in correspondence with a group of data to be searched. In the state in FIG. 4A, a group "Group#0" is selected. In contrast, in the first embodiment, as illustrated in a state in FIG. 4B, the memory system 1 includes a block selection circuit 28 that accepts the control signal from the command division control unit 23 and outputs a signal to the TCAM array block 300. In the state in FIG. B, the group "Group#0" and a group "Group#1" are set to be searched in accordance with the profile. Pre-charging to the match line of each group is controlled by the command division control unit 23. In the state in FIG. 4B, the search processing is divided and the group "Group#0" is set to be searched. Thereby, it is possible for the control circuit 100 to make the switch between whether the CAM cell array of the TCAM array block 300 is divided into the plurality of blocks and the blocks are searched in order and whether the respective entries are searched in parallel without dividing the CAM cell array in units of blocks.

Incidentally, it is assumed that the search processing to be performed by dividing the CAM cell array is executed by software processing. In this case, when a high processing speed is requested in packet filtering of a network router and so forth, there are cases where it is difficult to implement the requested processing speed. This is because the load on processing for managing the results of search performed on the respective blocks and merging the results of search performed on the respective blocks is large. In particular, in software processing using a general-purpose CPU (Central Processing Unit), performance is lowered. Since in the network system, it is particularly requested that the devise do not get out of order and processing be stably performed, in general, the system is designed by providing a performance margin of about 20% to about 100%. Accordingly, since the CAM memory system operates by assuming the load of large traffic that would occur instantaneously, it is possible for the CAM memory system to operate stably even when a traffic amount reaches a peak that is assumed. However, since the search processing is performed in the same manner even in case of the traffic amount not reaching the peak, this hinders attainment of low power consumption. On the other hand, according to the first embodiment, since the load on the control circuit 100 is monitored by the queue monitor unit 10 and whether the search processing is performed by dividing the CAM cell array of the TCAM array block 300 is determined in accordance with a result of monitoring, it is possible to implement further low power consumption. That is, the control circuit 100 determines whether the search processing is performed by dividing the CAM cell array of the TCAM array block 300 autonomously, and thereby it becomes possible to work the peak power in a state of approaching the average power and it is possible to suppress the power consumption. It is possible to increase the degree of freedom of board design and power supply design by implementing lower power consumption.

Figure 5B:
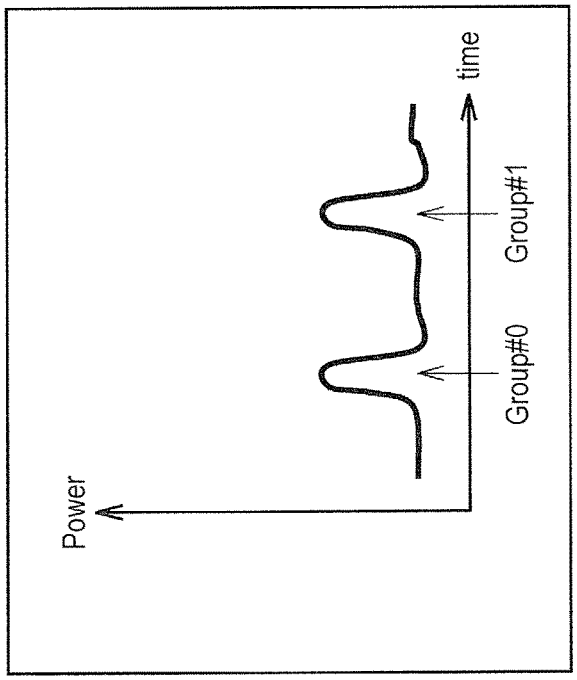
FIG. 5B is a diagram illustrating one example of a state of power consumption reduction attained by divisionally performing the retrieval processing on the TCAM array block 300.
Figure 5A:
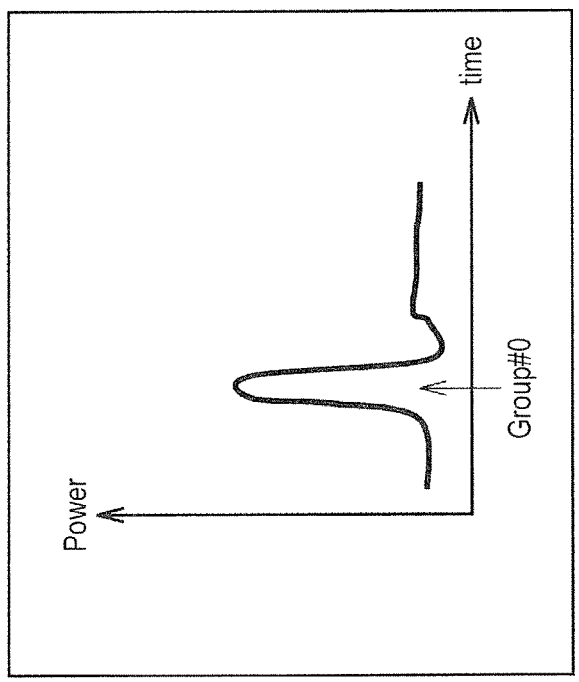
FIG. 5A is a diagram illustrating one example of a state before power consumption reduction.

FIG. 5A and FIG. 5B are diagrams illustrating examples of attaining low power consumption by performing the search processing by dividing the CAM cell array of the TCAM array block 300. FIG. 5A is a diagram illustrating one example of a state of the power consumption of the memory system 1 when searching when the search processing is performed on the CAM cell array with no division. FIG. 5B is a diagram illustrating one example of a state of the power consumption of the memory system 1 when searching when the search processing is performed by dividing the CAM cell array of the TCAM array block 300 into two parts. As illustrated by the state in FIG. 5B, although the time taken for completion of the search processing is increased, it is possible to level the peak power by performing the search processing by dividing the CAM cell array into two parts, in comparison with the case in FIG. 5A.

Figure 6A:
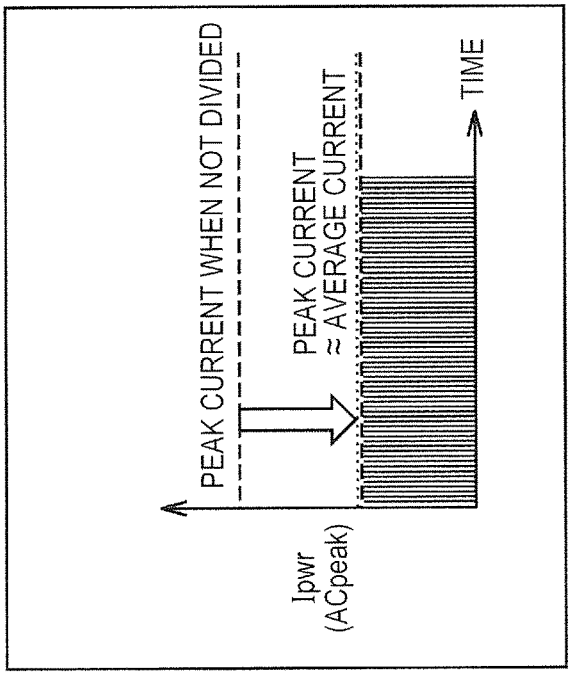
FIG. 6A is a diagram illustrating one example of peak current levelling attained by averaging processing to be performed on the TCAM array block 300.
Figure 6B:
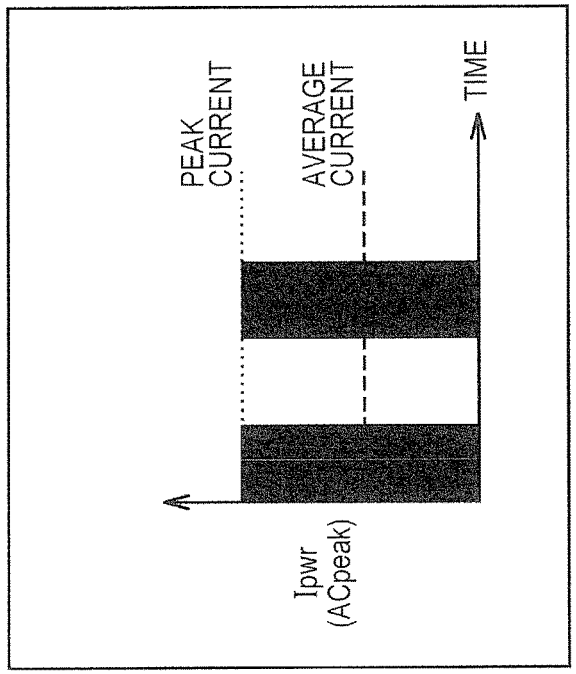
FIG. 6B is a diagram illustrating another example of peak current levelling attained by averaging processing to be performed on the TCAM array block 300.

FIG. 6A and FIG. 6B are diagrams illustrating examples of levelling of the peak power attained by averaging the processing to be performed on the TCAM array block 300. FIG. 6A is a diagram illustrating one example of a state of the magnitude of the current in the memory system 1 when the searching processing has been performed on the CAM cell array with no division. In the state in FIG. 6A, the search processing is performed two times. FIG. 6B is a diagram illustrating one example of a state of the magnitude of the current of the memory system 1 when the search processing has been performed by dividing the CAM array cell of the TCAM array block 300 into two parts. As illustrated by the state in FIG. 6B, it is possible to approach the peak current to the average current by performing the search processing by dividing the CAM cell array, in comparison with a case where the search processing has been performed with no division as illustrated in FIG. 6A.

<Operation of the Semiconductor Device According to the First Embodiment>

Figure 7:
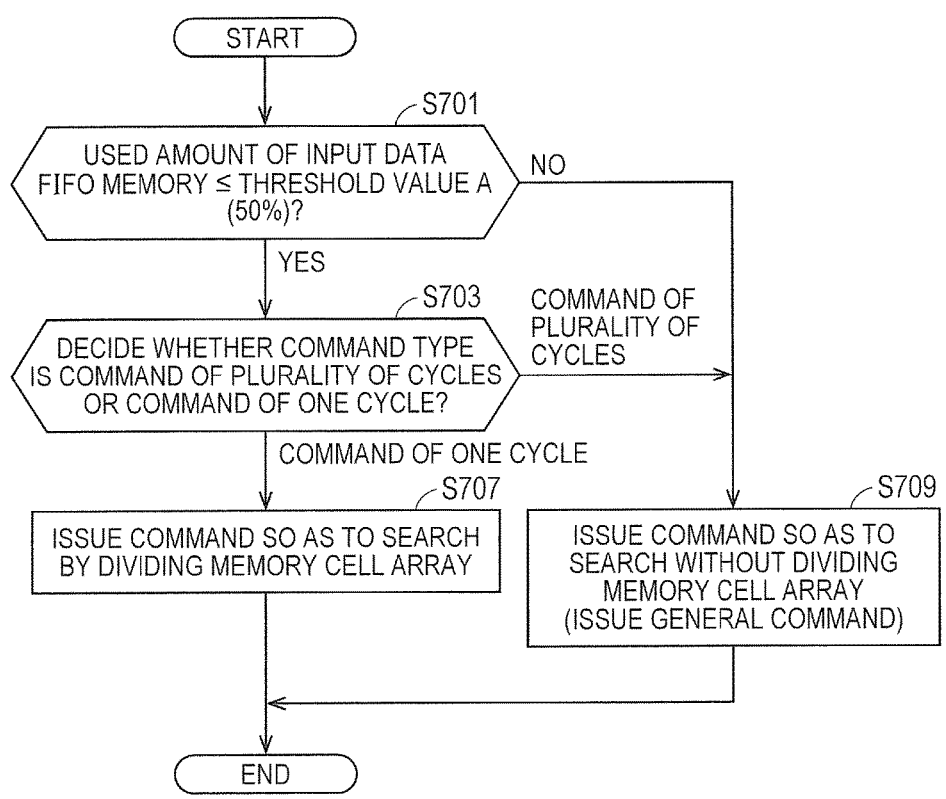
FIG. 7 is a flowchart illustrating one example of processing that the memory system 1 performs retrieval by determining a number of divisions in accordance with which the CAM cell array is retrieved in accordance with a usage state of a queue.

FIG. 7 is a flowchart illustrating one example of processing that the memory system 1 performs the search processing by determining the number of divisions (herein after, referred to as the division number) in order to perform the search processing on the CAM cell array in accordance with the usage state of the queue. The processing illustrated in FIG. 7 is started when, for example, the processing command management unit 21 acquires the search command held in the input data FIFO memory 12.

In step S701, the search control unit 20 accepts the signal indicating the usage state of the input data FIFO memory 12 in order to decide whether the inflow amount of data into the memory system 1 is at least the fixed amount. When the inflow amount of data into the memory system 1 is at least the fixed amount, that is, the used amount of the input data FIFO memory 12 is in excess of the fixed amount (NO in step S701), a process in step S709 is performed. When the inflow amount of data into the memory system 1 is not more than the fixed amount, that is, the used amount of the input data FIFI memory 12 is not in excess of the fixed amount (YES in step S701), a process in step S703 is performed. As an alternative, the queue management unit 14 may monitor the used amounts of the input data FIFO memory 12 and the output data FIFO memory 13 and may decide whether a number of staying queues is not more than the threshold value that is set in the threshold value setting register 15. When the number of staying queues is not more than the threshold value (YES in step S701), the queue management unit 14 outputs a signal indicating that the inflow amount of data into the memory system 1 is not more than the fixed amount to the search control unit 20. While, in other case (NO in step S701), the queue management unit 14 outputs a signal indicating that the inflow amount of data into the memory system 1 is at least the fixed amount to the search control unit 20. The search control unit 20 accepts the signal that the queue management unit 14 outputs in this way and thereby decides whether the inflow amount of data into the memory system 1 is at least the fixed amount.

In step S703, the search control unit 20 decides whether a command that is input into the memory system 1 is a command of a plurality of cycles or a command of one cycle.

Whether the command that is input into the memory system 1 is the command of the plurality of cycles or the command of one cycle is decoded by the command decoder 11. When it is decided that the command that is input into the memory system 1 is the command of the plurality of cycles ("Command of Plural Cycles" in step S703), the search control unit 20 performs a process in step S707, and when it is decided that the command that is input into the memory system 1 is the command of one cycle, the search control unit 20 performs the process in step S709.

In step S707, the search control unit 20 issues a command to the TCAM array block 300 in accordance with the setting indicated by the setting management unit so as to perform the search processing by dividing the CAM cell array of the TCAM array block 300 in accordance with the division number.

In step S709, the search control unit 20 issues a command to the TCAM array block 300 in accordance with the setting indicated by the setting management unit 25 so as to perform the search processing without dividing the CAM cell array of the TCAM array block 300.

Figure 8:
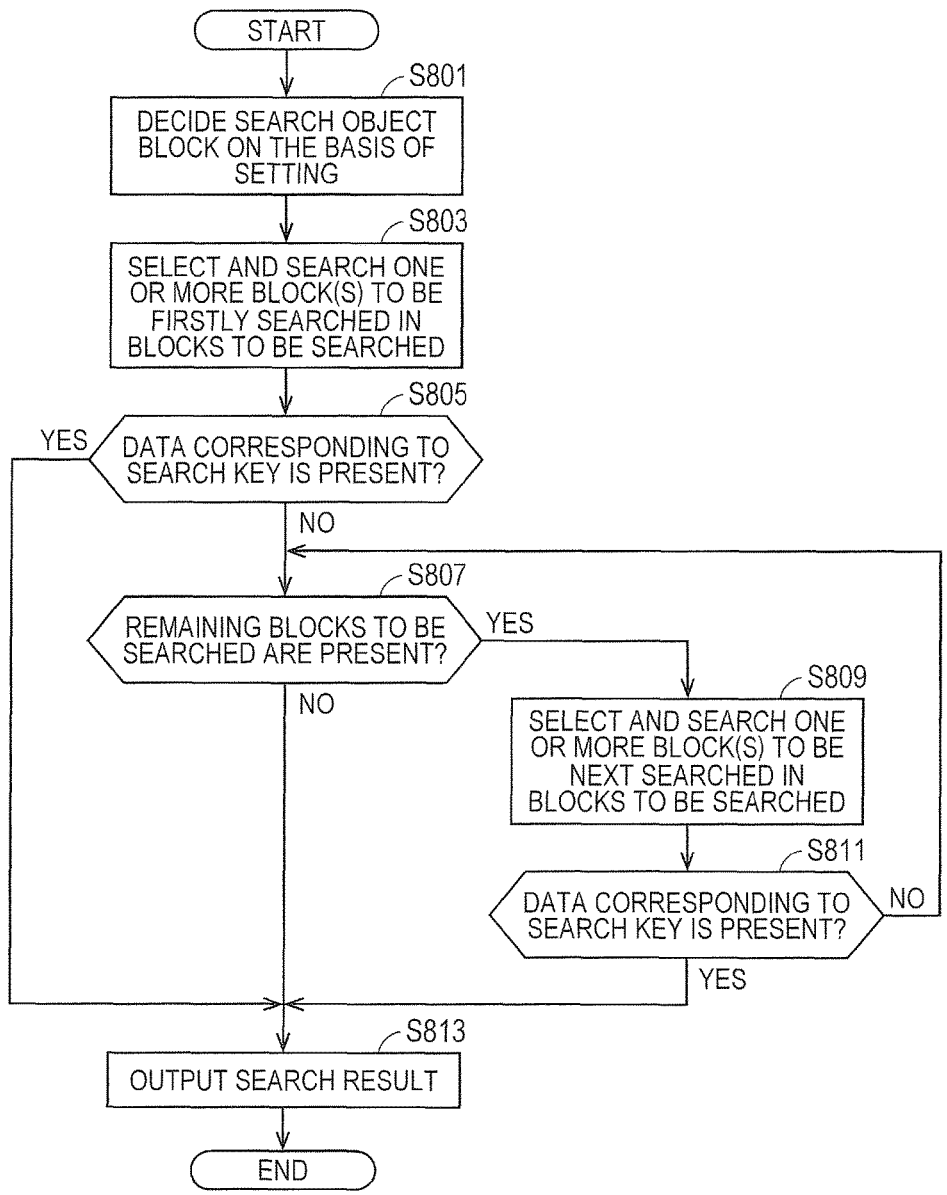
FIG. 8 is a flowchart illustrating one example of an operation that a retrieval control unit 20 performs retrieval by dividing the CAM cell array of the TCAM array block 300.

FIG. 8 is a flowchart illustrating one example of an operation that the search control unit 20 performs the search processing by dividing the CAM cell array of the TCAM array block 300.

In step S801, the search control unit 20 decides the block to be searched in the blocks so divided of the CAM cell array of the TCAM array block 300 in accordance with the setting (information on one or more block(s) to be searched, information on the division number and other pieces of information that are indicated in profile information of the TCAM array block 300 that the control circuit 100 stores) indicated by the setting management unit 25.

In step S803, the search control unit 20 selects one or more block (s) to be firstly searched in the blocks to be searched of the CAM cell array of the TCAM array block 300 and searches the selected block(s). For example, the search control unit 20 selects the block to be firstly searched on the basis of the degree of priority sets for each block.

In step S805, the search control unit 20 decides where there exists data corresponding to the search key in the block that has been selected to be searched on the basis of a signal that is output from the priority encoder 700 to the control circuit 100. When there exists the data corresponding to the search key (YES in step S805), the control circuit 100 performs a process in step S813 and in other case (NO in step S805), the control circuit 100 performs a process in step S807.

In step S807, the search control unit 20 decides whether there exists the block that is not selected to be searched in the blocks to be searched (whether there exist remaining blocks to be searched. When there exists the block that is not selected to be searched (YES in step S807), the control circuit 100 performs a process in step S809 and in other case (NO in step S807), the control circuit 100 performs the process in step S813.

In step S809, the search control unit 20 selects one or more block(s) to be searched next in the blocks that are not yet selected to be searched in the blocks to be searched and searches the selected block(s). For example, the search control unit 20 selects the block to be searched next on the basis of the degree of priority set for each block.

In step S811, the search control unit 20 decides whether there exists the data corresponding to the search key in the block that has been selected to be searched on the basis of a signal that is output from the priority encoder 700 to the control circuit 100. When there exists the data corresponding to the search key in the block concerned (YES in step S811), the control circuit 100 performs the process in step S813 and in other case (NO in step S811), the control circuit 100 performs the process in step S807.

In step S813, the output control unit 30 outputs a result of search that has been merged by the search result merge unit 26 to the circuit that is arranged outside the memory system 1.

According to the processing illustrated in FIG. 8, when the data corresponding to the search key is output as the result of search in a case of performing the search processing by dividing the CAM cell array, the control circuit 100 outputs the result of search and terminates the processing even when there exists the block that is not selected to be searched. In general, since the degree of priority is set to each entry (each block) in the CAM cell array, the search processing may be terminated at the stage that the result of search has been obtained from the block that is high in degree of priority in this way. Thereby, it is possible to more reduce the power consumption of the memory system 1.

Second Embodiment

Next, a memory system included in a semiconductor device according to the second embodiment will be described.

In the second embodiment, in regard to the CAM cell array of the TCAM array block 300, it is possible to set a maximum number of blocks to be searched as a threshold value in advance. When the range to be searched of the CAM cell array is in excess of the threshold value, the control circuit 100 performs the search processing by dividing the CAM cell array of the TCAM array block 300. For example, it is possible to set the maximum number of the blocks to be searched in advance in the setting management unit 25. Incidentally, the control circuit 100 may accept information on the threshold value from the outside of the memory system 1 (for example, the circuit that is arranged outside the memory system 1), the threshold value may be stored into a nonvolatile memory such as a flash memory and so forth, and the information on the threshold value may be acquired from a signal from an electrical fuse, in addition to setting of the threshold value in the setting management unit 25.

The search control unit 20 is configured so as to manage an upper limit set value (the threshold value) of the range of the CAM cell array that is set as the search processing object in this way. When the range of the CAM cell array that is set as the search processing object on the basis of the search data that is input into the control circuit 100 is in excess of the upper limit set value, the search control unit 20 performs the search processing on each part obtained by dividing the CAM cell array into a plurality of parts as the search processing object.

Figure 9:
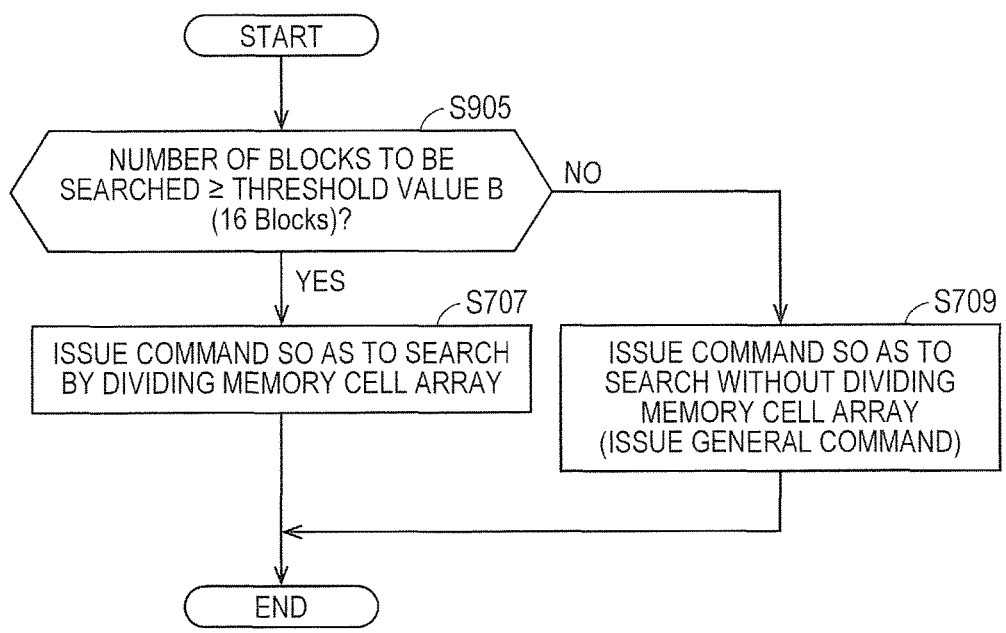
FIG. 9 is a flowchart illustrating one example of processing that the memory system 1 according to a second embodiment controls whether the CAM cell array is divisionally retrieved in accordance with a maximum threshold value of the number of blocks to be retrieved.

FIG. 9 is a flowchart illustrating one example of processing that the memory system 1 according to the second embodiment performs control as to whether the search processing is performed by dividing the CAM cell array in accordance with the maximum threshold value of the number of blocks to be searched.

In step S905, the search control unit 20 decides whether the number of blocks to be searched in the CAM cell array is in excess of the maximum number that is set as the threshold value. When the number of the blocks to be searched is in excess of the maximum number that is set as the threshold value (YES in step S905), the control circuit 100 performs the process in step S707. In other case (NO in step S905), the control circuit 100 performs the process in step S709.

The control circuit 100 reads the information as to which block is to be searched out of, for example, a storage area (a profile register) of the setting management unit 25 in this way. For example, the range of the blocks to be searched is held in a register, a memory area for management and other storage areas as the profile in accordance with the kind of data when the data to be searched is a table, when the data to be searched is an ACL (Access Control List) table, when the data to be searched is a forwarding table and other cases. The control circuit 100 refers to the profile and acquires the information on the range of the blocks to be searched in accordance with the kind of data indicated in the search command concerned. In the second embodiment, when the range of the blocks to be searched is in excess of the maximum number of the blocks that is set as the threshold value, the control circuit 100 performs the search processing by dividing the CAM cell array. The size of the block to be divided is defined to be within a range not reaching the maximum number of the blocks that is set as the threshold value. It becomes possible to limit the magnitude of the power consumption to be consumed when searching to the magnitude of the power consumption that is consumed when the search processing is performed on the blocks of the maximum number corresponding to the threshold value and it is possible to promote low power consumption by doing in this way. Thereby, it is possible to avoid a reduction in power supply to the board that would occur when the peak power is large and to reduce generation of ground noise.

That is, it is possible to save time and labor of taking such measures that a large number of bypass capacitors are arranged on the board, the impedance of the power source network is minimized that have ever been taken as anti-noise measures by suppressing the magnitude of the power consumption that is consumed when searching to less than a fixed value. Thereby, it is possible to facilitate various designs such as the power supply design, the board design and so forth. In particular, recently, there is a tendency that the number of pieces of equipment to be coupled to the network is increased and there is also a tendency that the range to be searched is increased. Therefore, it is desired to set the impedance of the power supply to be not more than a fixed value (for example, not more than about 0.5 mΩ). In the second embodiment, it is possible to set the maximum number of the blocks to be searched in advance depending on restriction conditions of power supply setting and it is possible to facilitate the designs such as the power supply design, the board design and so forth.

Third Embodiment

Next, a memory system included in a semiconductor device according to the third embodiment will be described.

Figure 10:
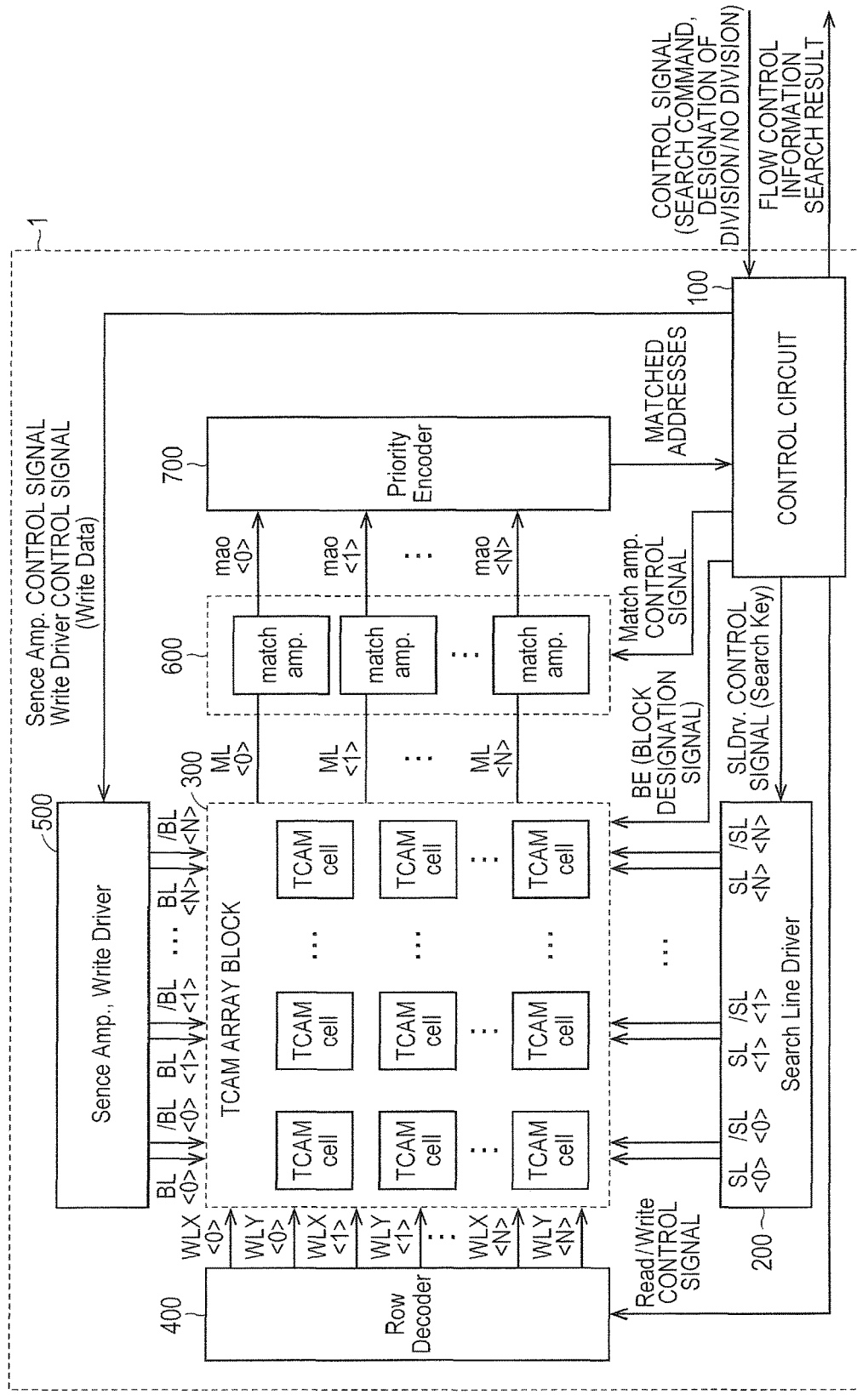
FIG. 10 is a diagram illustrating one example that the memory system 1 according to a third embodiment accepts a designation as to whether the CAM cell array is divisionally retrieved from an external system.

FIG. 10 is a diagram illustrating one example that the memory system 1 according to the third embodiment accepts designation as to whether the search processing is performed by dividing the CAM cell array from an external system. The control circuit 100 in FIG. 10 accepts a control signal that includes a flag as to whether the search processing is performed by dividing the CAM cell array, information on the maximum number of the blocks to be searched and so forth from the circuit that is arranged outside the memory system 1.

In the third embodiment, a system (a host-side system that manages the memory system 1) that issues the search command to the memory system 1 makes it possible to perform designation as to whether the search processing is performed by dividing the CAM cell array of the TCAM array block 300 to the memory system 1. It is possible to optionally perform designation as to whether the search processing is performed by dividing the CAM cell array from the circuit that is arranged outside the memory system 1 or the host-side system that manages the memory system 1 in a command-based manner. Thereby, since it is possible to reduce the latency taken for exchange of signals between the memory system 1 and the host side system, control of the memory system 1 from the host side system is performed in more real time. For example, it is possible for a controller that manages a plurality of devices at the system level to monitor information as to how much the respective devices to be managed conflict with one another, on what extent of the load each device operates and so forth and to decide whether the search processing is performed by dividing the CAM cell array of the memory system 1 depending on the extent of confliction among the devices, the extent of the load on each device.

The memory system 1 is configured to accept input of the search data that includes designation as to whether the search processing is performed by dividing the CAM cell array into the plurality of parts and selecting at least one of the parts as the search processing object in this way. The search control unit 20 is configured to adjust the speed of the search processing in accordance with the designation included in the search data.

Fourth Embodiment

Next, a memory system included in a semiconductor device according to the fourth embodiment will be described.

Figure 11:
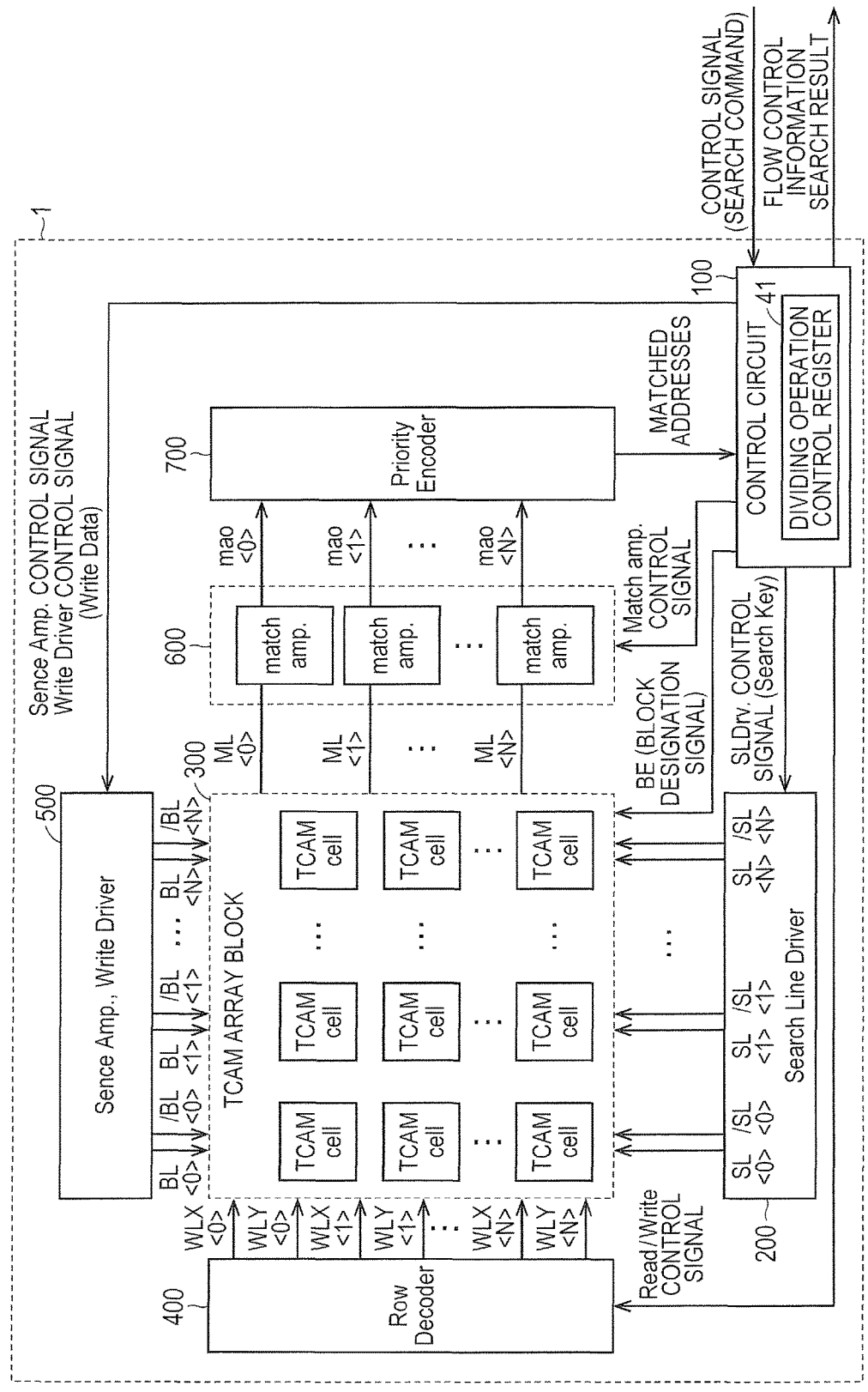
FIG. 11 is a diagram illustrating one example of a configuration that the memory system 1 according to a fourth embodiment holds a value in a division operation control register 41 in the control circuit 100 and controls whether the CAM cell array is divisionally retrieved in accordance with the value in the division operation control register 41.

FIG. 11 is a diagram illustrating one example of a configuration that the memory system 1 according to the fourth embodiment holds a value in a dividing operation control register 41 in the control circuit 100 and performs control as to whether the search processing is performed by dividing the CAM cell array in accordance with the value in the dividing operation control register 41.

It is possible for the memory system 1 to restrict the number of bank activations of the CAM cell array and to make setting as to whether a reduction in peak power is preferred and whether the performance of the search processing to be performed on the CAM cell array is preferred. The control circuit 100 performs the search processing on the CAM cell array in accordance with the setting that is indicated in the dividing operation control register 41. It is possible to make designation as to whether the search processing is performed by dividing the CAM cell array, for example, in correspondence with a time zone in the dividing operation control register 41. However, even in a time zone for which it is designated to perform the search processing by dividing the CAM cell array, the performance of the search processing may be preferred without performing the search processing by dividing the CAM cell array in accordance with a result of monitoring by the queue monitor unit 10. For example, in a time zone and so forth for which the traffic of the network is increased, the search processing is performed by preferring the performance without performing the search processing by dividing the CAM cell array in accordance with the setting of the partitioning operation control register 41 in order to increase the stability of routing processing and so forth. On the other hand, in a time zone for which the traffic load of the network is reduced, it is also possible to cope with the processing that the performance is preferred when load fluctuations have occurred, while performing the search processing by dividing the CAM cell array for attaining low power consumption.

The memory system 1 is configured so as to store the setting as to whether the search control unit 20 performs the search processing, targeting on at least one of the parts obtained by dividing the CAM cell array into the plurality of parts as the search processing object, or whether the search control unit 20 performs the search processing, targeting on the entire of the CAM cell array as the search processing object, in the dividing operation control register 41. The search control unit 20 is configured to perform the search processing in accordance with the setting indicated in the dividing operation control register 41.

Fifth Embodiment

Next, a memory system included in a semiconductor device according to the fifth embodiment will be described.

FIG. 12 is a table illustrating one example that in the control circuit 100 of the memory system 1 according to the fifth embodiment, the threshold value setting register 15 holds settings of the division number according to the remaining amount of the queues at multiple stages.

It is possible to reduce a change that would occur in performing the search processing when striding over the threshold values indicated in the threshold setting register 15 and it is possible to stabilize the processing by making the division number (a number of times of the search processing performed) when the search processing is performed by dividing the CAM cell array settable at multiple stages with the packing ratio of the FIFO memory such as the input data FIFO memory 12 and so forth being set as a standard in this way.

In the example illustrated in FIG. 12, it is indicated that when the used amount (the packing ratio) of the queues in the FIFO memory is in excess of about 70% of the memory area that is allocated to the FIFO memory, the search control unit 20 prefers the performance of the search processing by performing the search processing on the entire of the CAM cell array one time without performing the search processing by dividing the CAM cell array. In addition, it is also indicated that when the used amount of the queues in the FIFO memory is less than about 10% of the memory area allocated to the FIFO memory, the search control unit 20 performs the searching processing on the CAM cell array five times by dividing the CAM cell array into five parts.

It is possible for the queue monitor unit 10 to set the threshold values of the multiple stages in the threshold setting register 15 such that the larger the used amount of the FIFO memory such as the input FIFO memory 12 and so forth becomes, the smaller the division number of the CAM cell array when performing the search processing becomes. The queue monitor unit 10 is configured to output the signal according to each stage to the search control unit 20 when the used amount of the FIFO memory exceeds each of the multi-stage threshold values that are set in the threshold value setting register 15. The search control unit 20 performs the search processing by dividing the CSM cell array into the plurality of parts depending on the division number according to the stage that is indicated in the signal that the queue monitor unit 10 outputs. In addition, when the search control unit 20 performs the search processing by dividing the CAM cell array, it is possible to reduce the power consumption and the peak power used for the search processing when the load is low by outputting the result of search by selecting in turn starting from the block that is higher than others in order of priority.

Sixth Embodiment

Next, a memory system included in a semiconductor device according to the sixth embodiment will be described.

FIG. 13 is a table illustrating one example indicating that in the control circuit 100 of the memory system 1 according to the sixth embodiment, the threshold value setting register 15 holds a threshold value with which the divisional search processing to be performed on the CAM cell array is started and a threshold value with which the divisional search processing that has been performed on the CAM cell array is terminated in accordance with the remaining amount of the queue.

It is possible for the queue monitor unit 10 to set a first threshold value used when the search control unit 20 performs the search processing by dividing the CAM cell array into the plurality of parts and a second threshold value used when the search control unit 20 performs the search processing on the entire CAM cell array without dividing the CAM cell array in correspondence with the used amount of the FIFI memory such as the input data FIFO memory 12 and so forth. When the queue monitor unit 10 outputs a signal according to the first threshold value, the search control unit 20 performs the search processing that the CAM cell array has been divided into the plurality of parts. When the queue monitor unit 10 outputs a signal according to the second threshold value, the search control unit 20 performs the processing that the entire CAM cell array has been set as the search processing object.

It is possible to avoid to repeat setting and resetting of the divisional search processing in the vicinity of the threshold values and it is possible to more stabilize the operation of the memory system 1 by holding the threshold value used when the search processing to be performed by dividing the CAM cell array is started and the threshold value used when the divisional search processing is terminated respectively in the threshold value setting register 15. In the example in FIG. 13, when the packing ratio of the FIFO memory exceeds about 70% of the memory area, the performance is preferred, and the search processing that the CAM cell array is divided is not performed and the search processing is performed on the entire CAM cell array one time. When the packing ratio of the FIFO memory is gradually lowered and has reached about 50%, the search control unit 20 starts again the search processing that the CAM cell array is divided. The operation of the memory system 1 is stabilized by applying hysteresis characteristics to the threshold value setting register 15 in this way.

Seventh Embodiment

Next, a memory system included in a semiconductor device according to the seventh embodiment will be described.

Figure 14:
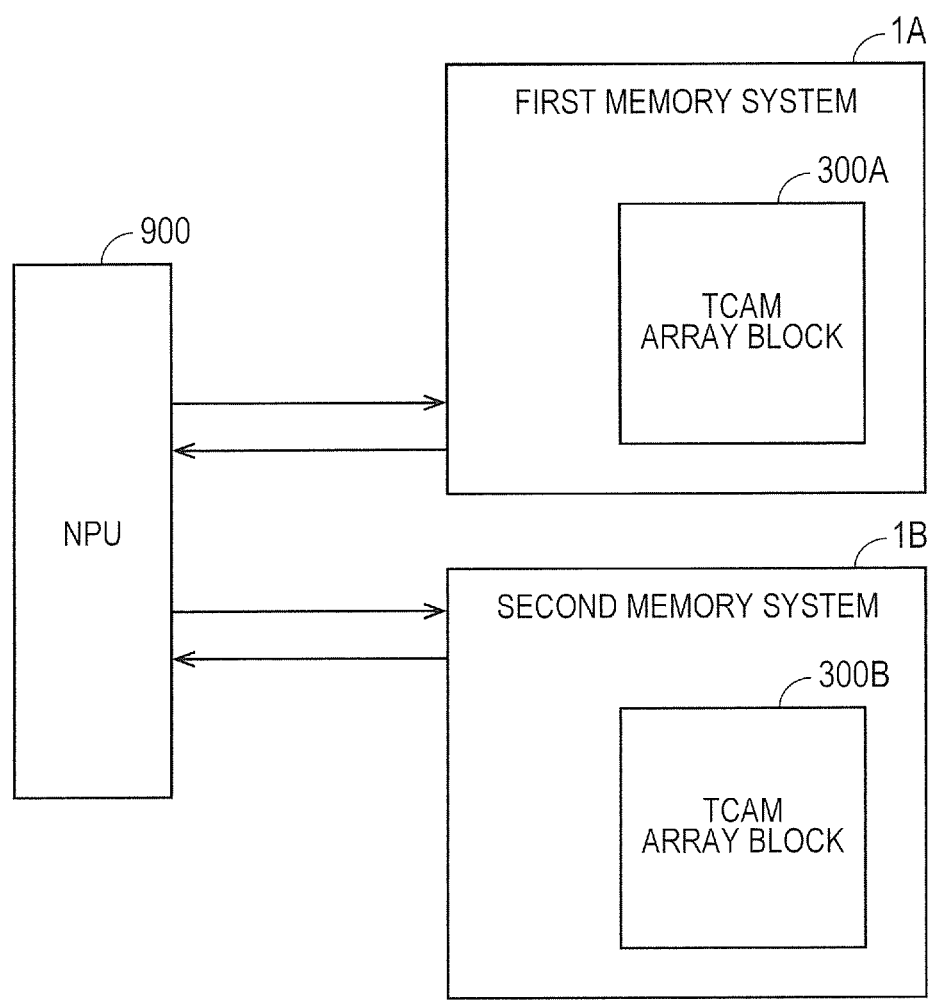
FIG. 14 is a diagram illustrating one example of a configuration that a semiconductor circuit according to a seventh embodiment includes the plurality of memory systems and a host-side memory system in the plurality of memory systems designates whether the retrieval processing is performed by dividing the CAM cell array or the retrieval processing is performed without dividing the CAM cell array to the respective remaining memory systems.

FIG. 14 is a diagram illustrating one example of a configuration obtained when the semiconductor device according to the seventh embodiment includes the plurality of memory systems and the host side system of these memory systems makes designation to each memory system as to whether the search processing is performed by dividing the CAM cell array or with no division of the CAM cell array.

The semiconductor device includes the plurality of memory systems and is configured to make it possible to perform the search processing on the CAM cell array included in each of the memory systems. Each of the memory systems accepts the designation as to whether each part obtained by dividing any one of the CAM cell arrays of the plurality of memory systems into the plurality of parts is set as the search processing object and performs the search processing in accordance with the accepted designation.

In the example in FIG. 14, the configuration that the semiconductor device includes the plurality of memory systems described in each embodiment. The semiconductor device includes a first memory system 1A and a second memory system 1B. The first memory system 1A includes a TCAM array block 300A. The second memory system 1B includes a TCAM array block 300B. An NPU 900 operates as the host side system for the memory systems 1A and 1B and controls each memory system. Each of the memory systems may have the setting independently and may operate in accordance with the setting. For example, the first memory system 1A may be operated on the basis of the configuration of the memory system 1 according to the first embodiment and the second memory system 1B may be operated on the basis of the configuration of the memory system 1 according to the second embodiment. In addition, signal wiring that couples the NPU with the memory system, such as signal wiring that couples the NPU 900 with the memory system 1A may be parallelized as illustrated in FIG. 14 and switching of options of the search processing to be performed on the CAM cell array may be performed via the parallelized signal wiring. Control of the memory systems becomes also possible while effectively utilizing wiring resources by doing in this way.

In addition, each memory cell may be configured to perform control as to whether the search processing is performed by dividing the CAM cell array on the basis of information from the circuit that is arranged outside the memory system such as the NPU 900 and so forth. For example, the first memory system 1A may accept a signal indicating the current power consumption of the semiconductor device, the loaded state of each piece of equipment and so forth and may determine whether the search processing is performed by dividing the CAM cell array and what number is set as the division number. For example, in the semiconductor device, the electric power fluctuation of the entire system that configures the semiconductor device may be reduced by performing the search processing by dividing the CAM cell array, for example, when the loads and the power consumptions of other pieces of equipment are high, and by performing the search processing without dividing the CAM cell array, for example, when the loads on the other pieces of equipment are low, on the basis of information indicating states of the loads, the power consumptions and other processing of pieces of equipment other than the first memory system 1A.

Eighth Embodiment

In the following, a memory system included in a semiconductor device according to the eighth embodiment will be described.

Figure 15:
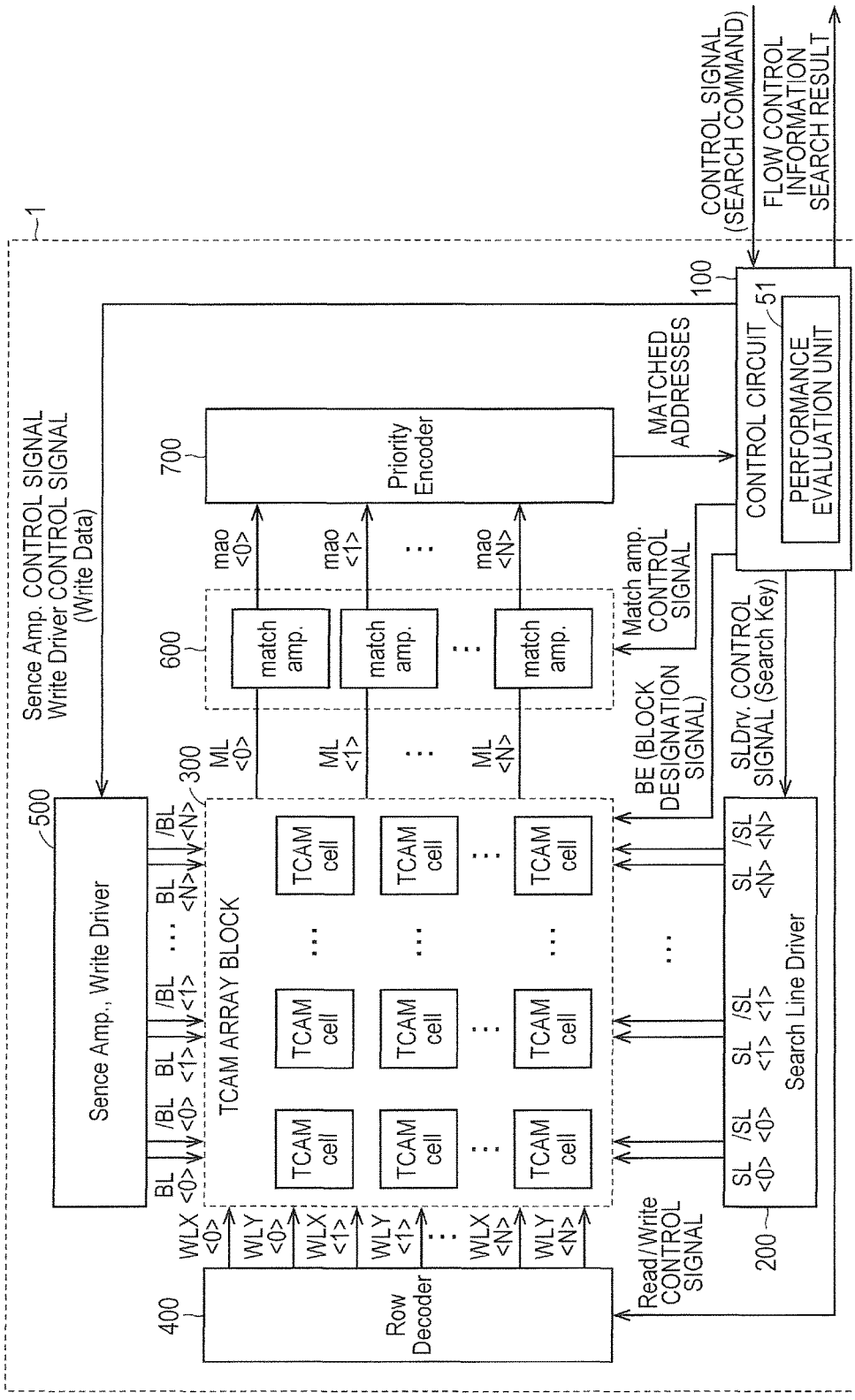
FIG. 15 is a diagram illustrating one example of a configuration that the memory system 1 according to an eighth embodiment includes a performance evaluation unit 51 and monitors manufacturing variation of the memory system 1 and controls division of the retrieval processing on the CAM cell array in accordance with a result of monitoring.

FIG. 15 is a diagram illustrating one example of a configuration that the memory system 1 according to the eighth embodiment includes the performance evaluation unit 51, monitors the variation in manufacturing of the memory system 1 and controls division of the search processing to be performed on the CAM cell array in accordance with a result of monitoring.

The performance evaluation unit 51 that the memory system 1 includes also monitors the variation in manufacturing of at least any of the respective circuits included in the semiconductor device. The search control unit 20 is configured to determine the division number on the basis of which each part of the CAM cell array is set as the search processing object in accordance with a result of monitoring of the variation in manufacturing by the performance evaluation unit 51.

Figure 16:
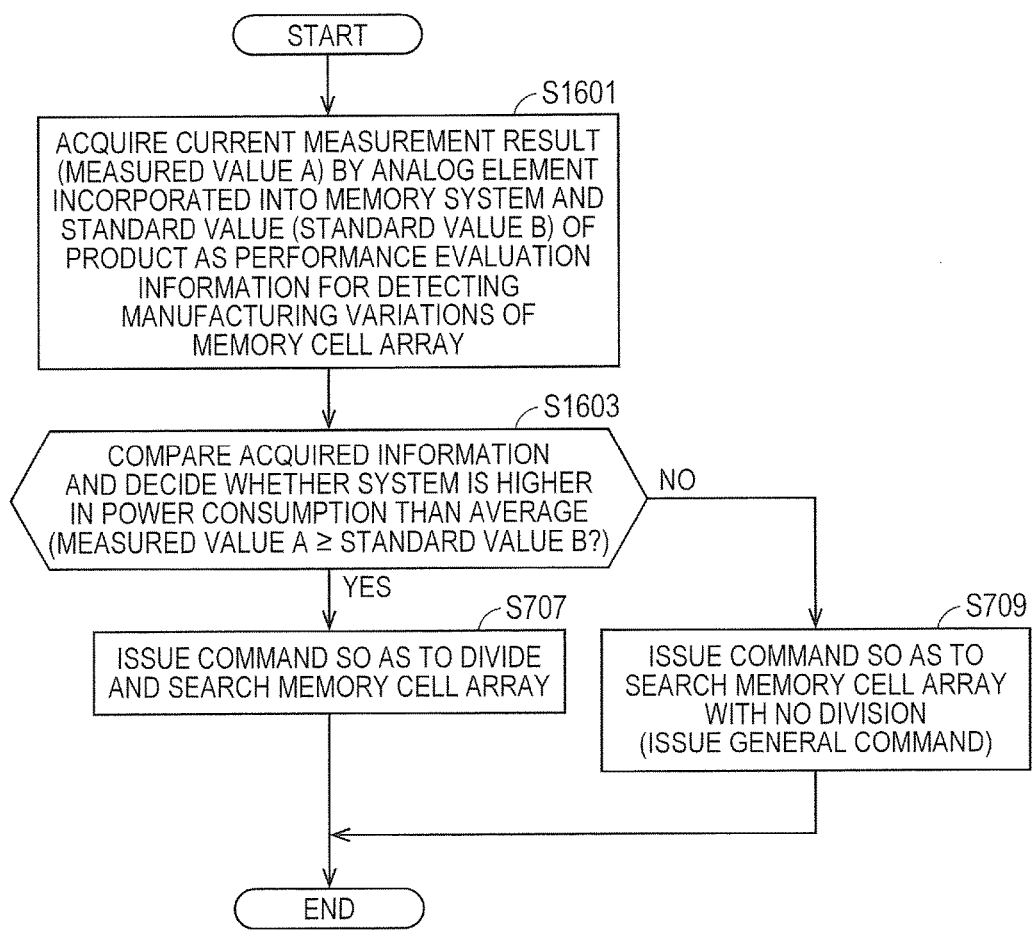
FIG. 16 is a flowchart illustrating one example of processing that the control circuit 100 according to the eighth embodiment controls the number of divisions in the retrieval processing to be performed on the CAM cell array on the basis of a result of evaluation of the manufacturing variation of the memory system 1.

FIG. 16 is a flowchart illustrating one example of processing that the control circuit 100 according to the eighth embodiment controls the division number for the search processing to be performed on the CAM cell array (that is, the division number on the basis of which the search processing is performed on the CAM cell array) on the basis of the result of evaluation of the variation in manufacturing of the memory system 1.

In step S1601, the control circuit 100 acquires a result of current measurement (a measured value A) by an analog element that is incorporated into the memory system 1 and a standard value (a standard value B) that is determined in advance for each product and is held in the control circuit 100 as information used for evaluating the performance of the memory system 1 by the performance evaluation unit 51. The standard value is set as the standard value B by measuring a current value when the memory system 1 is configured to have an average power consumption.

In step S1603, the control circuit 100 decides whether the memory system 1 is a system that is higher in power consumption than the standard of an average power consumption by comparing the acquired information (the measured value A and the standard value B). When the memory system 1 is the memory system that is higher in power consumption than the standard of the average power consumption (YES in step S1603), the control circuit 100 performs the process in step S707 and in other case (NO in step S1603), the control circuit 100 performs the process in step S709.

In addition, when the memory system 1 has a power consumption that is higher than the standard of the average power consumption, the setting may be changed such that the division number for the search processing to be performed on the CAM cell array is set larger than usual (the system of the average power consumption) and the number of areas to be searched simultaneously is reduced and so forth. In addition, when the memory system 1 has a power consumption that is lower than the standard of the average power consumption, the setting may be changed such that the division number for the search processing to be performed on the CAM cell array is set smaller than usual (the system of the average power consumption) and the number of areas to be searched simultaneously in each block included in the CAM cell array is increased and so forth.

In addition, although it is possible to measure information on the current, the voltage and so forth of the semiconductor device by utilizing an analog element that is incorporated into a microcomputer and so forth, a mechanism for directly detecting an amount of change in the power supply, a mechanism for directly measuring a power supply voltage and other mechanisms and/or a technology for sensing the current and so forth may be incorporated into the semiconductor device.

Ninth Embodiment

Next, a memory system included in a semiconductor device according to the ninth embodiment will be described.

FIG. 17A to FIG. 17C are diagrams illustrating examples of a configuration that the memory system 1 according to the ninth embodiment holds the history of the division number when the search processing has been performed on the CAM cell array and corrects the division number of the search processing to be performed on the CAM cell array on the basis of the history.

The search control unit 20 is configured to hold the history of the division number when the search processing has been performed by dividing the CAM cell array into the plurality of parts and is also configured to determine the division number on the basis of which the CAM cell array is divided into the plurality of parts in accordance with the history of the division number.

FIG. 17A illustrates one example of a state of information that is set in the threshold value setting register 15 at a certain point of time and lists the used amount of the queues and the division number of the search processing to be performed on the CAM cell array in one-to-one correspondence. FIG. 17B is a diagram illustrating one example of a data structure of division number history information 29. For example, the control circuit 100 holds the division number history information 29 and updates the division number history information 29 every time the search processing is performed on the CAM cell array. The division number history information 29 indicates the history of the division number of the search processing in a fixed period. In the example in FIG. 17B, the division coefficient [3] (three-division) is the highest in frequency [60%]. FIG. 17C illustrates one example of information that lists the used amount of the queue and the division number of the search processing to be performed on the CAM cell array in one-to-one correspondence when setting to be held in the threshold value setting register 15 has been updated. Specifically, the memory system 1 adds a count corresponding to the division number every time the division number of the search processing to be performed on the CAM cell array is determined in the control circuit 100. The control circuit 100 ranks the division numbers that have been used in a cycle every time a fixed cycle has passed. The control circuit 100 performs adjustment by increasing the range of the threshold value and so forth on the basis of the division number that is the largest in the number of times as a result of ranking. Incidentally, the threshold value used when the search processing is performed without dividing the CAM cell array may not be made variable and may be fixed. Thereby, when the processing load is at least the fixed amount, it becomes possible to operate the memory system 1 by preferring the performance.

The control circuit 100 specifies the division number that is the largest in frequency in the division number history information 29 and updates the set value with which it is possible to divide the CAM cell array the most efficiently in the memory system 1 in this way. Thereby, it is possible to stabilize the power supply and stabilization of the power supply contributes to stabilization of the operation of the semiconductor device that includes the memory system 1.

Tenth Embodiment

Next, a memory system included in a semiconductor device according to the tenth embodiment will be described.

Figure 18:
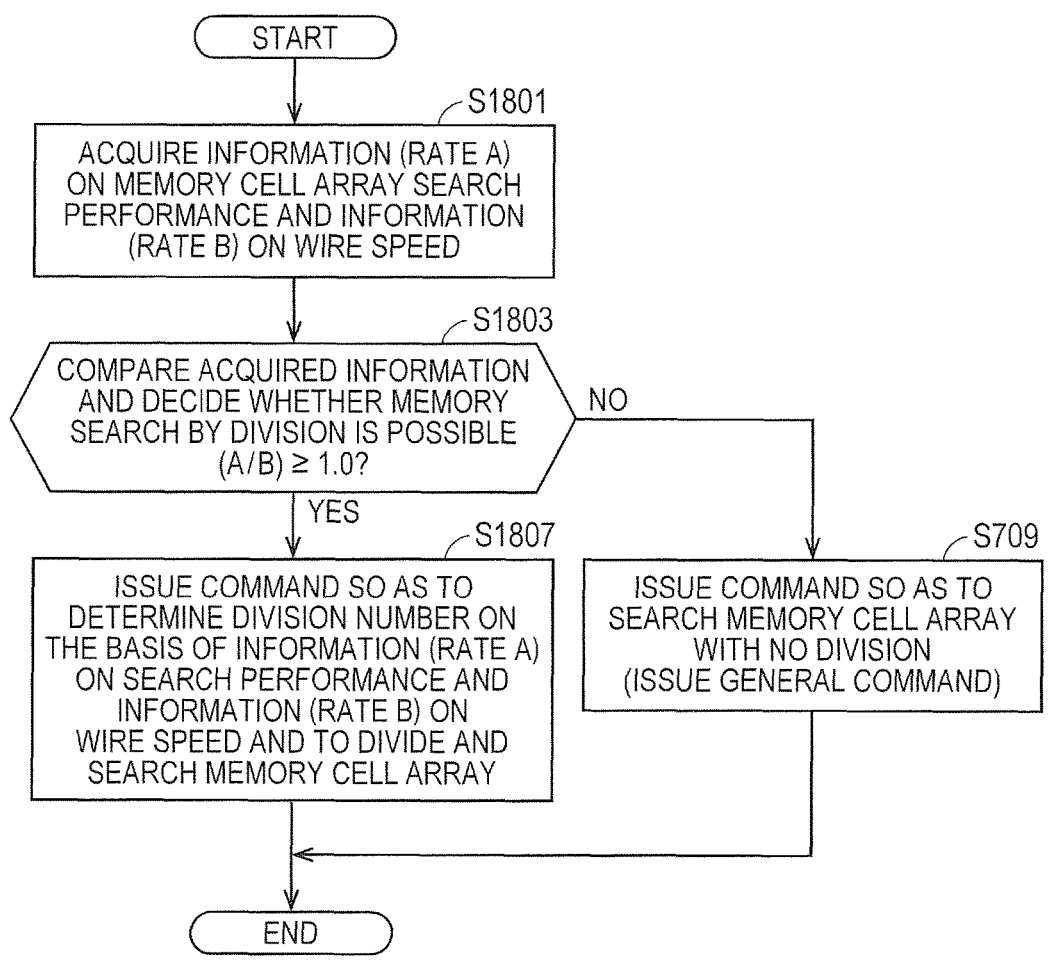
FIG. 18 is a flowchart illustrating one example of an operation of the memory system 1 to be performed when the memory system 1 according to a tenth embodiment divides the retrieval processing to be performed on the CAM cell array only in response to a specific command.

FIG. 18 is a flowchart illustrating one example of an operation of the memory system 1 when the memory system 1 according to the tenth embodiment divisionally performs the search processing on the CAM cell array only in response to a specific command. The memory system 1 controls the division number when performing the search processing on the CAM cell array, for example, coping with a wire speed that is requested for a system that includes the memory system 1. For example, it is assumed that the system transfers 64-byte data that is the smallest in frame size. In this case, the size of the data that the system transfers amounts to 84 bytes (672 bits) in total that includes 8 bytes for a preamble part, 64 bytes for a data part as the frame size, and 12 bytes for a gap (Inter Frame Gap) that is left until the next frame is transmitted and it is requested to process the data of the above-mentioned data volume in a defined period of time. For example, when the system guarantees the wire speed of about 400 GHz, it is requested to transfer the data of 64 bytes in frame size in a period of time of about 1.68 ns as indicated in [Formula 1] as the search performance (about 595 Mbps).

$$(1/400\ GHz)*(8+64+12)*8=1.68\ ns \qquad \text{[Formula 1]:}$$

On the other hand, when the frame size of the data part is 512 bytes, it is requested to transfer the data of 512 bytes in frame size in a period of time of about 10.64 ns as indicated in [Formula 2] (about 94.0 Mbps).

$$(1/400\ GHz)*(8+512+12)*8=10.64\ ns \qquad \text{[Formula 2]:}$$

In this case (the frame size of the data part is 512 bytes), when it is possible for the search engine of the memory system 1 to perform the search processing one time at about 600 MHz, it becomes possible to perform the search processing by dividing into parts corresponding to nine times. In recent years, it is possible to construct some sets of virtual networks by one piece of equipment owing to development of the technology of virtualizing the network. In the field of the virtual networks, it is more and more requested to make the effective wire speed variable in accordance with the number of the virtual networks. According to the tenth embodiment, it is possible to provide the performance that is adapted to the rate of the search performance, conforming with fluctuations in wire speed.

The search control unit 20 is configured to perform the search processing that the CAM cell array has been divided into the plurality of parts when the specific command is included in the search data input of which the semiconductor device accepts.

In step S1801, the search control unit 20 acquires information (information on the speed of the search processing: a rate A) on the search performance for searching the CAM cell array and information (a rate B) on the wire speed from, for example, the circuit that is arranged outside the memory system 1, the register of the control circuit 10 and so forth.

In step S1803, the search control unit 20 decides whether it is possible to divisionally perform the search processing on the CAM cell array by comparing the pieces of information acquired in step S1801. For example, the search control unit 20 decides whether the value of an arithmetic expression (the rate A/the rate B) exceeds a comparison value [1.0]. In step S1803, when it has been decided that it is possible to divisionally perform the search processing on the CAM cell array (YES in step S1803), the search control unit 20 performs a process of step S1807 and in other case (NO in step S1803), the search control circuit 20 performs the process of step S709.

In step S1807, the search control circuit 20 calculates a result of arithmetic operation of the arithmetic expression (the rate A/the rate B) on the basis of the information (the rate A) on the search performance and the information (the rate B) on the wire speed and determines the division number when performing the search processing on the CAM cell array on the basis of a result of calculation. The search control circuit 20 performs the search processing on the CAM cell array in accordance with the determined division number. For example, when the result of arithmetic operation of the arithmetic expression (the rate A/the rate B) is at least the value [0] and less than the value [2], the search control circuit 20 determines to perform the search processing on the CAM cell array with no division. In addition, for example, when the result of arithmetic operation of the arithmetic expression (the rate A/the rate B) is at least the value [2] and less than the value [3], the search control circuit 20 determines to perform the search processing by dividing the CAM cell array into two parts. Likewise, the search control circuit 20 determines the division number on the basis of which the CAM cell array is divided in accordance with the value of the arithmetic expression (the rate A/the rate B). For example, when the rate A is a rate [about 600 MHz] and the rate B is a rate [about 94 Mbps], the value [6.37] is obtained as the result of arithmetic operation of the arithmetic expression (the rate A/the rate B) and therefore the search control circuit 20 determines to perform the search processing by dividing the CAM cell array into six parts.

Eleventh Embodiment

Next, a memory system included in a semiconductor device according to the tenth embodiment will be described.

The memory system 1 according to the eleventh embodiment determines the division number when performing the search processing on the CAM cell array in accordance with the setting. When the packing ratio of the input data FIFO memory 12 and so forth that the queue monitor unit 10 monitors exceeds a certain threshold value, the memory system 1 outputs data to the device that is arranged outside the memory system 1 by deleting overflown processing and adding an error log, in order to avoid such a situation that the equipment that accepts a result of processing performed by the memory system 1 performs an unstable operation caused by overflow by deleting the overflown processing. The control circuit 100 may delete the overflown processing, for example, in accordance with the result of monitoring by the queue monitor unit 10 and may decide whether the data that the control circuit 100 is processing is deleted as the overflown processing on the basis of a control signal from the outside of the memory system 1 (for example, the circuit that is arranged outside the memory system 1) and, in particular, a management signal from a higher layer.

Twelfth Embodiment

Next, a memory system included in a semiconductor device according to the tenth embodiment will be described.

Figure 19:
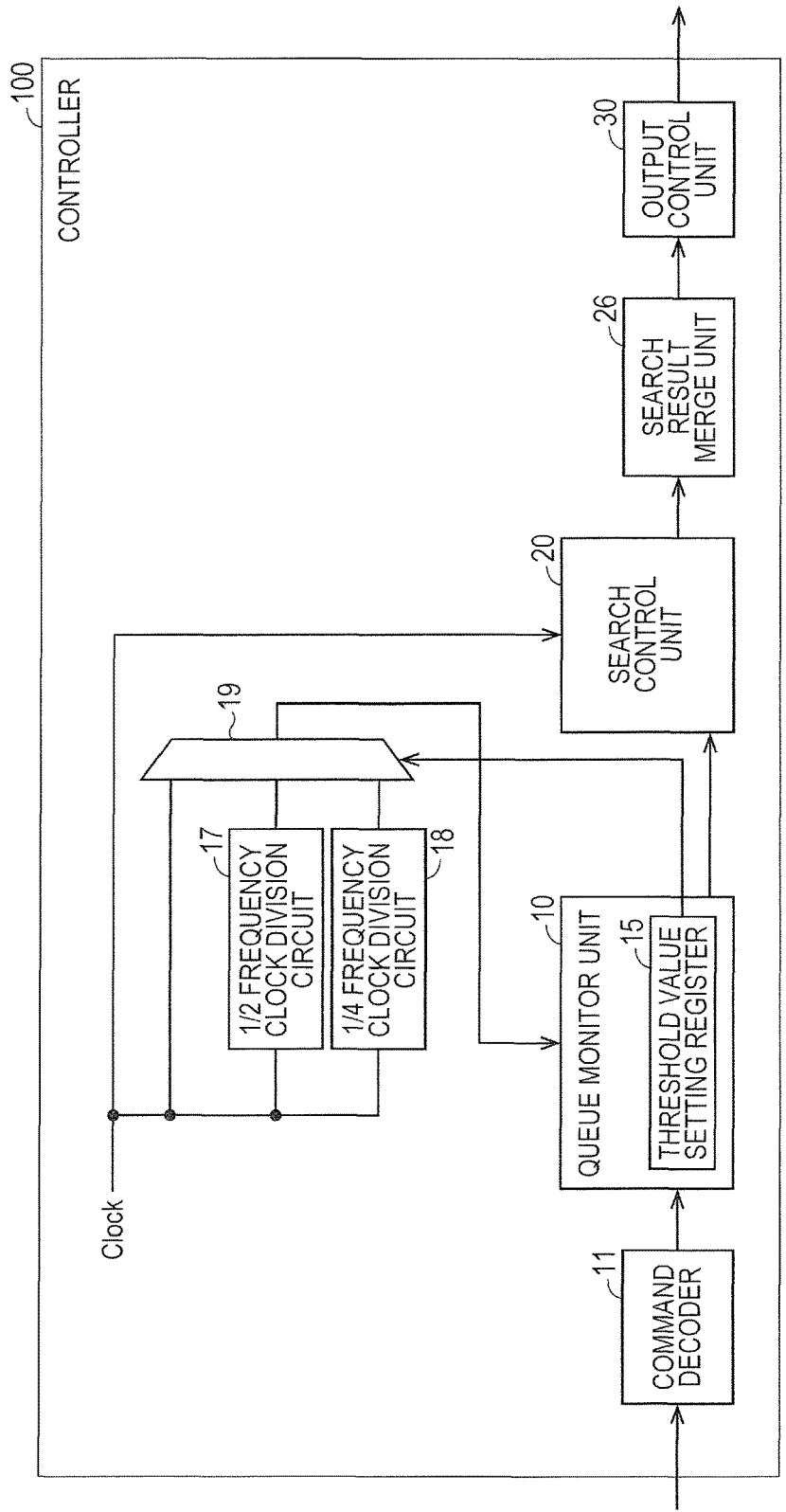
FIG. 19 is a diagram illustrating one example of a configuration of the control circuit 100 according to a twelfth embodiment.]

FIG. 19 is a diagram illustrating one example of a configuration of the control circuit 100 according to the twelfth embodiment. As illustrated in FIG. 19, the control circuit 100 according to the twelfth embodiment includes configurations (a ½ frequency clock division circuit 17, a ¼ frequency clock division circuit 18 and a frequency-divided clock control circuit 19) adapted to dividing the frequency of a clock signal and inputting the frequency-divided clock signal into the queue monitor unit 10. The ½ frequency clock division circuit 17 divides the frequency of the clock signal that is input into the control circuit 100 by two and outputs the frequency-divided clock signal. The ¼ frequency clock division circuit 18 divides the frequency of the clock signal that is input into the control circuit 100 by four and outputs the frequency-divided clock signal.

The control circuit 100 inputs a general clock signal into the search control unit 20 and makes a clock signal to be into the queue monitor unit 10 switchable by the frequency-divided clock signal control circuit 19. Thereby, it becomes possible for the control circuit 100 to effectively implement division of a fraction in order to divide the search processing to be performed on the CAM cell array. In the example in FIG. 19, the control circuit 100 includes the plurality of clock division circuits (the ½ frequency clock division circuit 17 and the ¼ frequency clock division circuit 18). Although not illustrated in FIG. 19, it is assumed that, for example, the control circuit 100 inputs a clock signal that has been divided by 5 in frequency into the queue monitor unit 10 and inputs a signal that is not divided in frequency into the search control unit 20. In this case, the queue monitor unit 10 manages a status of a command that is input from the outside of the control circuit 100 using the clock signal that has been divided by 5 in frequency. In this case, the search control circuit 2o tries to perform the search processing on the CAM cell array in two parts. In this case, the effective processing speed of the control circuit 100 is reduced to a speed of a ratio [⅖] in comparison with the speed obtained when the clock signal is not frequency-divided. That is, according to the control circuit 100 of the twelfth embodiment, it is possible to adjust the division number of the search processing to be performed on the CAM cell array not only by an integer value but also by the fraction. Incidentally, although in FIG. 19, the example that the control circuit 100 includes the clock division circuits has been described, the configuration of the control circuit 100 is not limited to this example. It is also possible to adjust the division number of the search processing to be performed on the CAM ell array not only by the integer value but also by the fraction also by, for example, a configuration that a counter that counts the number of the clock signals is arranged in the control circuit 100 and the signal is output to the queue monitor unit 10 when the number of the clock signals has reached a fixed count value.

Thirteenth Embodiment

Next, a memory system included in a semiconductor device according to the tenth embodiment will be described.

Figure 20:
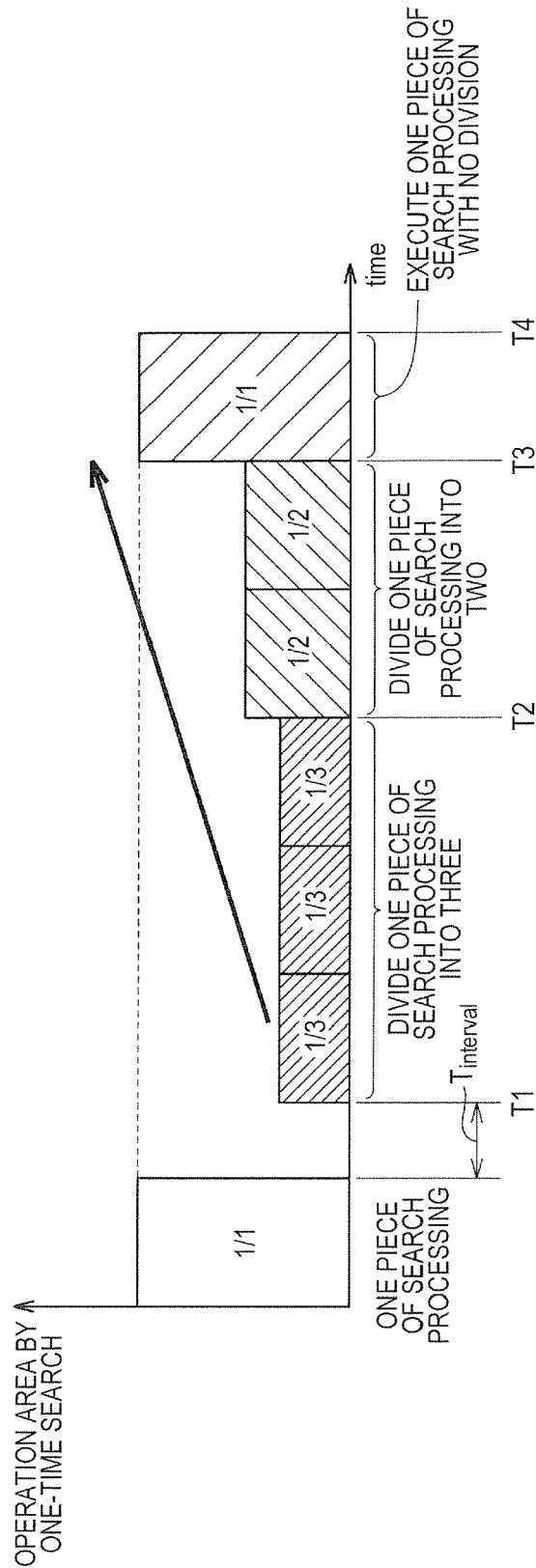
FIG. 20 is a diagram illustrating one example of processing of stepwise reducing the number of divisions in the retrieval processing when the memory system 1 according to a thirteenth embodiment has performed the retrieval processing on the CAM cell array leaving an interval that is longer than a defined value period.

FIG. 20 is a diagram illustrating one example of processing of stepwise reducing the division number of the search processing when the memory system 1 according to the thirteenth embodiment has performed the search processing on the CAM cell array after an interval that is longer than a specified value period.

The search control circuit 20 is configured to measure a length of the interval at which the search processing is performed on the CAM cell array repetitively. The search control circuit 20 is configured to divisionally perform the search processing on the plurality of the divided parts of the CAM cell array and to stepwise reduce the division number on the basis of which the CM cell array is divided when the search processing on the CAM cell array is started again after the length of the interval has exceeded the length of a fixed (for example, the specified value) period.

As illustrated in FIG. 20, it is assumed that after the search processing has been performed on the CAM cell array and then an interval that has been specified in advance has elapsed, the control circuit 100 has performed the search processing on the CAM cell array. In this case, the control circuit 100 performs the search processing by dividing the CAM cell array into the plurality of parts. In the example in FIG. 20, when the search processing is performed on the CAM cell array after the interval that has been specified in advance has elapsed (a time T1), the control circuit 100 performs the search processing by dividing one piece of search processing into three parts (the time T1 to a time T2). Then, the control circuit 100 performs the search processing on the CAM cell array by reducing the division number of the search processing (the time T2 to a time T3). Then, when the division number of the search processing has been reduced (in the example in FIG. 20, it is reduced from the division number [1] to the division number [0]), the control circuit 100 performs the search processing on the CAM cell array (the time T3 to a time T4).

It is possible to more improve the stability of the power supply to the memory system 1 by gradually increasing the range to be searched of the CAM cell array after the search processing has been started in this way. In addition, it is possible to more reduce the power consumption of the system including the memory system 1.

Here, the period that is set as the interval (T Interval) has a length of a period for which change occurs in the responsiveness of the power supply, the supply capability of the power supply and other characteristics of the power supply because after the search processing has been performed on the CAM cell array with no division ([One Piece of Search Processing] in FIG. 20), the load on the power supply system of the semiconductor device is reduced. Since this interval period is different among the systems, the interval may be made settable from the circuit that is arranged outside the memory system 1.

The control circuit 100 performs the search processing on the CZAM cell array, and thereafter counts the period for which an NOP (no operation) state is established and decides whether the period of the NOP state exceeds the term (T Interval) that has been set as the interval. When the period of the NOP state is in excess of the period that has been set as "Interval", the control circuit 100 outputs a signal (the signal BE) for divisionally performing the search processing on the CAM cell array.

Incidentally, although, in the example illustrated in FIG. 20, when the search processing is performed on the CAM ell array after the period of the NOP state has exceeded the period that has been set as the interval has passed, the search processing is performed by setting the division number to [3], the division number is not limited to the division number [3]. In addition, although in FIG. 20, the example that the division number is gradually reduced is illustrated, when it is possible to confirm the stability of the power supply, the dividing operation may be terminated in addition to the above.

CONCLUSION

The control circuit 100 according to the embodiments of the present disclosure performs the search processing on the CAM cell array divisionally, from the viewpoint of detecting the stagnation state of the queues and the loaded state of the queue to be input into the control circuit 100 and suppressing the peak power on the basis of the result of detection of the stagnation state and the loaded state of the queue in order to determine the range to be searched of the CAM cell array.

When the equipment performs pattern matching processing at a high speed by using the memory system such as the CAM and so forth, the design is comparatively often made by taking a margin, assuming the high-load state. For example, the equipment that is used in the network system is often configured by providing a performance margin of about 20% to about 100% by taking the points that maintenance of the equipment is facilitated and the operation of the equipment is stabilized into consideration. This is because when the network is configured in a data center, at a service base and so forth, a great loss occurs when the network enters a shutdown state. Accordingly, the equipment often performs the search processing with a processing performance exceeding a line rate and the peak power is increased. Since the power supply voltage of the equipment is lowered by increasing the peak power and a reduction in power supply voltage may induce malfunctions, it is requested to reduce the impedance of the board. In addition, when the equipment performs the search processing on the CAM ell array by using the general purpose processor and by dividing the search processing by software processing, management is complicated and processing when merging the results of the divisionally performed searching processing is performed by software processing using the general purpose processor, and therefore the performance of the equipment is reduced. In particular, when the equipment processes a high-speed traffic load, there are cases where it is difficult for the software processing to process the high speed traffic load at a determined line rate.

The equipment uses the memory system that has been described in the above mentioned embodiments in order to solve the above mentioned disadvantages. Thereby, it is possible to suppress a reduction in power supply voltage by reducing the peak power while performing the pattern matching processing at a high speed. The equipment manages the remaining amount of the queues and so forth and thereby self-diagnoses the state of the search processing of the system. When it is possible for the equipment to perform processing with the set processing capability, the search processing is performed by dividing it into two or more parts and then the results of the processing so performed divisionally are merged in order to reduce the peak power. It is possible for the circuit that is arranged outside the memory system to handle the search processing that has been divisionally performed on the memory system as one piece of processing by doing in this way.

Although in the foregoing, the invention that has been made by the inventors and others has been specifically described on the basis of the preferred embodiments of the present invention, it goes without saying that the present invention is not limited to the above-mentioned embodiments and may be altered and modified in a variety of ways within the range not deviating from the gist of the present invention.

It would be considered that the embodiments that have been disclosed here are merely illustrative and not restrictive in all points. The scope of the present disclosure is indicated not by the above-mentioned description but by the claims and it is intended that meanings equivalent to the claims and all modifications and alterations that have been made within the scope of the claims are included.

What is claimed is:

1. A semiconductor device configured to accept input of search data and search in parallel respective rows of a memory cell array for data that is held in a memory, the semiconductor device comprising:
   a search control unit configured to detect whether an inflow amount of the search data that is input is at least a fixed amount and to adjust a speed of search processing performed on the memory;

an output control unit configured to output a signal indicating a result of the search processing performed on the memory; and a monitor unit configured to monitor the inflow amount of the search data that is input and output a signal when the inflow amount of the search data is at least the fixed amount, wherein the search control unit adjusts the speed of the search processing performed on the memory includes to perform the search processing by setting at least one of parts obtained by dividing the memory cell array into a plurality of parts as an object of the search processing, wherein the search control unit adjusts the speed of the search processing performed on the memory according to the result of the retrieval processing on the basis of the signal that the monitor unit outputs, and wherein the monitor unit includes an FIFO (First In First Out memory) configured to hold the search data that is input and is configured to output the signal when a used amount of the FIFO memory exceeds a fixed amount.

2. The semiconductor device according to claim 1, wherein the search control unit is configured to manage an upper limit set value of a range of the memory cell that is set as the object of the search processing, and the search data that is input includes to perform the search processing by setting each of the parts obtained by dividing the memory cell array into the parts as the object of the search processing when the range to be searched in the memory cell array exceeds the upper limit set value.

3. The semiconductor device according to claim 1, wherein the semiconductor device is configured to accept input of the search data that includes designation as to whether the search processing is performed on at least one of the parts obtained by dividing the memory cell array into the parts as the object of the search processing, and wherein the search control unit is configured to adjust the speed of the search processing in accordance with the designation included in the search data.

4. The semiconductor device according to claim 1, wherein the semiconductor device is configured to store setting as to whether the search control unit performs the search processing on at least one of the parts obtained by dividing the memory cell array into the parts as the object of the search processing or whether the search control unit performs the search processing on the entire of the memory cell array as the object of the search processing, and wherein the search control unit is configured to perform the search processing in accordance with the setting.

5. The semiconductor device according to claim 1, wherein the monitor unit is configured to set threshold values of a plurality of stages such the larger the used amount of the FIFO memory becomes, the smaller a number of divisions of the memory cell array becomes and to output the signal according to each stage when the used amount exceeds each of the threshold values of the stages, and wherein the search processing that the search control unit performs includes to perform the search processing by dividing the memory cell array into parts depending on the number of divisions according to the stage that is indicated by the signal that the monitor unit outputs.

6. The semiconductor device according to claim 1, wherein the semiconductor device is configured to search each of the plurality of memory cell arrays, and wherein the search processing that the search control unit performs includes to accept designation as to whether each of the parts obtained by dividing any one of the memory cell arrays into the parts and to perform the search processing in accordance with the accepted designation.

7. The semiconductor device according to claim 1, further comprising:

a performance evaluation unit configured to monitor variations in manufacturing of at least any one of respective circuits in the semiconductor device, wherein the search control unit is configured to determine the number of divisions for setting each part of the memory cell array as the search processing object in accordance with a result of monitoring of the variations in manufacturing performed by the performance evaluation unit.

8. The semiconductor device according to claim 1, wherein the search control unit is configured to hold a history of the number of divisions when the search processing has been performed by dividing the memory cell array into the parts, and is configured to determine the number of divisions that the memory cell array is divided into the parts in accordance with the history of the number of divisions.

9. The semiconductor device according to claim 1, wherein the search control unit is configured to perform the search processing that the memory cell array is divided into the parts when a specific command is included in the search data input of which the semiconductor device accepts.

10. The semiconductor device according to claim 1, wherein the search control unit is configured to measure a length of an interval at which the search processing is repetitively performed, and is configured to perform the search processing that the memory cell array is divided into the parts and to stepwise reduce the number of divisions that the memory cell array is divided when the length of the interval exceeds a fixed period and the search processing has been started again.

11. A semiconductor device configured to accept input of search data and search in parallel respective rows of a memory cell array for data that is held in a memory, the semiconductor device comprising:

a search control unit configured to detect whether an inflow amount of the search data that is input is at least a fixed amount and to adjust a-speed of search processing performed on the memory; and an output control unit configured to output a signal indicating a result of the search processing performed on the memory, wherein a monitor unit is configured to set a first threshold value with which the search control unit performs the search processing by dividing the memory cell array into the parts and a second threshold value with which the search control unit sets the entire of the memory cell array as the object of the search processing without dividing the memory cell array for the used amount of the FIFO memory, and wherein the search processing that the search control unit performs includes to perform the search processing that the memory cell array is divided into the parts when the monitor unit outputs the signal according to the first threshold value, and to perform the search processing that the entire of the memory cell array is set as the object of the search processing when the monitor unit outputs the signal according to the second threshold value.

\* \* \* \* \*